US006943616B2

(12) United States Patent
Ogawa et al.

(10) Patent No.: US 6,943,616 B2
(45) Date of Patent: Sep. 13, 2005

(54) SEMICONDUCTOR INTEGRATED CIRCUIT DEVICE, AND ADJUSTMENT METHOD OF SEMICONDUCTOR INTEGRATED CIRCUIT DEVICE

(75) Inventors: Yasushige Ogawa, Kasugai (JP); Yoshiyuki Ishida, Kasugai (JP); Masato Matsumiya, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 88 days.

(21) Appl. No.: 10/648,272

(22) Filed: Aug. 27, 2003

(65) Prior Publication Data

US 2004/0041595 A1 Mar. 4, 2004

(30) Foreign Application Priority Data

Aug. 28, 2002 (JP) ........................................ 2002-248134
Jul. 4, 2003 (JP) ........................................ 2003-192151

(51) Int. Cl.[7] .............................................. G05F 1/10
(52) U.S. Cl. ...................................... 327/538; 327/525
(58) Field of Search ................................. 327/525, 530, 327/538–541

(56) References Cited

U.S. PATENT DOCUMENTS 6,414,535 B1 * 7/2002 Ooishi ......................... 327/538

FOREIGN PATENT DOCUMENTS

JP 11-044736 2/1999
JP 2001-229697 8/2001

* cited by examiner

Primary Examiner—Kenneth B. Wells
(74) Attorney, Agent, or Firm—Arent Fox PLLC

(57) ABSTRACT

It is intended to provide a semiconductor integrated circuit device and adjustment method of the same semiconductor integrated circuit device, capable of adjusting an analog signal outputted from an incorporated analog signal generating section without outputting it outside as an analog value. An analog signal AOUT is outputted from an analog signal generating section 3 in which an adjustment signal AD is inputted. The analog signal AOUT is inputted to a judgment section 1, in which it is compared and judged with a predetermined value and then a judgment signal JG is outputted. The judgment signal JG acts on a predetermined signal storing section 4 as an internal signal and the adjustment signal AD is fetched into the predetermined signal storing section 4. Further, the judgment signal JG is outputted as digital signal through an external terminal T2 and an external tester device acquires the adjustment signal and stores the acquired adjustment signal in the predetermined signal storing section 4. Consequently, the analog signal can be adjusted as analog value without being outputted outside and an adjustment test can be carried out with a simple tester device and according to a simple test method accurately and rapidly.

20 Claims, 17 Drawing Sheets

CIRCUIT BLOCK DIAGRAM OF SECOND EMBODIMENT

FIRST PRINCIPLE DIAGRAM OF PRESENT INVENTION

SECOND PRINCIPLE DIAGRAM OF PRESENT INVENTION

FIG. 3 CIRCUIT BLOCK DIAGRAM OF FIRST EMBODIMENT

CIRCUIT DIAGRAM OF SPECIFIC EXAMPLE DIRECTED TO FIRST EMBODIMENT

OPERATIONAL WAVEFORM OF SPECIFIC EXAMPLE DIRECTED TO FIRST EMBODIMENT

TRIMMING TEST FLOW OF FIRST EMBODIMENT

CIRCUIT DIAGRAM OF VARIANT OF JUDGMENT SECTION (ENCODING TABLE)

| J<3> | J<2> | J<1> | J<0> | JG<2> | JG<1> | JG<0> | |
|---|---|---|---|---|---|---|---|
| 0 | 0 | 0 | 0 | 0 | 0 | 0 | |
| 0 | 0 | 0 | 1 | 0 | 0 | 1 | |
| 0 | 0 | 1 | 1 | 0 | 1 | 0 | ← (PREDETERMINED VALUE) |
| 0 | 1 | 1 | 1 | 0 | 1 | 1 | |
| 1 | 1 | 1 | 1 | 1 | 0 | 0 | |

FIG. 8  CIRCUIT BLOCK DIAGRAM OF SECOND EMBODIMENT

FIG. 9 CIRCUIT DIAGRAM OF SPECIFIC EXAMPLE DIRECTED TO SECOND EMBODIMENT

OPERATIONAL WAVEFORM OF SPECIFIC EXAMPLE DIRECTED TO SECOND EMBODIMENT

TRIMMING TEST FLOW OF SECOND EMBODIMENT

FIG. 12 CIRCUIT BLOCK DIAGRAM OF THIRD EMBODIMENT

FIG. 13 CIRCUIT DIAGRAM OF SPECIFIC EXAMPLE DIRECTED TO THIRD EMBODIMENT

FIG. 14  CIRCUIT DIAGRAM OF FIRST SPECIFIC EXAMPLE DIRECTED TO FOURTH EMBODIMENT

FIG. 15 CIRCUIT DIAGRAM OF SECOND SPECIFIC EXAMPLE DIRECTED TO FOURTH EMBODIMENT

CASE OF MULTIPLE JUDGMENT

CIRCUIT DIAGRAM OF PRIOR ART

CONVENTIONAL TRIMMING TEST FLOW

SEMICONDUCTOR INTEGRATED CIRCUIT DEVICE, AND ADJUSTMENT METHOD OF SEMICONDUCTOR INTEGRATED CIRCUIT DEVICE

CROSS-REFERENCE TO RELATED APPLICATIONS

This application is based upon and claims the benefit of priority from each of the prior Japanese Patent Application No. 2002-248134 filed on Aug. 28, 2002 and No. 2003-192151 filed on Jul. 4, 2003 the entire contents of which are incorporated herein by reference.

BACKGROUND OF THE INVENTION

1. Field of the Invention

The present invention relates to adjustment of analog signal outputted from an analog signal generating section of an internal power source circuit or the like incorporated in a semiconductor integrated circuit device, and more particularly to a semiconductor integrated circuit device in which interface for input-output signals is achieved by digital signal and adjustment method of the semiconductor integrated circuit device.

2. Description of Related Art

FIG. 17 shows an internal power source circuit 300 incorporated in a semiconductor integrated circuit device, a fuse circuit 400 for adjusting the voltage of an internal power source voltage VII, and a decoding circuit 600 as circuit examples based on conventional technology. The internal power source circuit 300 is constituted of a non-inverting amplification circuit employing an operational amplifier circuit. If a gate voltage of a PMOS transistor MP1 is controlled by an output signal of the operational amplifier circuit, a reference voltage VREF inputted from a reference terminal REF, which is an inverting input terminal, is subjected to non-inverting amplification so as to generate the internal power source voltage VII. An amplification rate at this time is determined by selecting resistance elements R, R0–R3 connected to a path from the output terminal of the internal power source voltage VII to the non-inverting input terminal VAF of the operational amplifier circuit. This selection is performed by supplying electricity to any one of transfer gates S0–S3 connected between the respective resistance elements R, R0–R3.

This selection is carried out by the decoding circuit 600. The decoding circuit 600 decodes predetermined signals FS<0>, <1> stored in the fuse circuit 400 and selects any one of decoding signals D<0>–D<3>. Two-phase signals of in-phase and anti-phase for each of the predetermined signals FS<0>, <1> are generated and logical add operation is executed by combining the respective signals so as to obtain the decoding signal D<0>–<3>.

The fuse circuit 400 is constituted of a resistance element and a fuse element and stores predetermined signals FS<0>, <1> for outputting a predetermined internal power source voltage VII. The fuse element is not cut out when a low level signal is stored and the fuse element is cut out when a high level signal is stored. In the semiconductor integrated circuit, individual device characteristics vary because of characteristic variation due to manufacturing reason and generally, the reference voltage VREF inputted to the reference terminal REF also varies. The predetermined signals FS<0>, <1> are signals for correcting this variation so as to output the predetermined internal power source voltage VII and is set up for each internal power source circuit 300. This setting work is called trimming work and carried out according to a test flow shown in FIG. 18.

In the test flow of FIG. 18, the internal power source voltage VII is measured with a tester device, which is an external device of the semiconductor integrated circuit. Because the fuse element is not cut out at this stage, the predetermined signals FS<0>, <1> are low level signals. A transfer gate S0 is selected in the internal power source circuit 300 so as to set up a minimum amplification rate. How the amplification rate of the internal power source circuit 300 should be changed can be calculated preliminarily based on a measured voltage value of the internal power source voltage VII. That is, a fuse element which should be cut out is predetermined depending on a difference between an initially measured voltage value of the internal power source voltage VII and the predetermined value. FIG. 18 shows a test flow for breaking a fuse element depending on the measured internal power source voltage VII.

If the initially measured internal power source voltage VII is a voltage value VIIX lower than a range adjustable by selecting the amplification rate (VII<VIIX), the semiconductor integrated circuit is a defective product. If it is over the predetermined voltage value VIIZ (VII≧VIIZ), the fuse element does not have to be cut out. If respective transfer gates S1, S2 are selected, the initially measured voltage values VII, which is to be set as the predetermined voltage value VIIZ, are assumed to be VII1, VII2. Consequently, if the initially measured voltage value VII is VIIX, VII2, VII1, VIIZ, a fuse element which should be cut out corresponding thereto is automatically determined.

According to a conventional technology, if the internal power source voltage VII in the semiconductor integrated circuit incorporating the internal power source circuit 300 is trimmed, the internal power source voltage VII needs to be measured according to a trimming test flow. Therefore, analog data which enables measurement of analog voltage needs to be used for the trimming test. If other analog circuit than the internal power source circuit 300 is loaded, the analog signal for adjustment needs to be also measured.

On the other hand, with intensification and miniaturization of semiconductor integrated circuit technology in recent years, the semiconductor integrated circuit in digital field, which is represented by system LSI, has been loaded with an analog circuit block containing analog function such as an internal power source circuit.

For the reason, the semiconductor integrated circuit, which employs digital signal as an input-output interface to an external terminal, needs to be provided with a special measuring terminal (analog terminal) for adjusting the analog signal such as the internal power source voltage, which is a problem to be solved.

More specifically, the analog circuit block, which is provided in the semiconductor integrated circuit, is disposed at an arbitrary position corresponding to semiconductor integrated circuit design. Where the analog terminal should be disposed differs depending on the design. A wiring path, wiring length, wiring load and the like from the analog circuit block to the analog terminal differ depending on the semiconductor integrated circuit design. In order to output an analog signal to the analog terminal at a high precision, a sufficient care needs to be taken to changes or the like of the analog value due to mixture of noise by digital signals from peripheral circuits block or adjacent wirings and wiring load on a wiring path for each design. Consequently, a great burden is applied to its design aspect in order to provide with a special analog terminal necessary for adjustment of the analog signal, which is a problem to be solved.

Further, with a test on the digital signal inputted/outputted into/from the digital terminal, an analog signal outputted from the analog terminal needs to be measured. That is, both digital test and analog test need to be carried out at the same time. Thus, it is necessary to prepare a tester device having both digital testing function and analog testing function. Consequently, the tester device becomes complicated and expensive, so that testing time automatically increases. Through-put from the test worsens and cost necessary for the test increases, which are problems which should be solved.

Further, the digital test and analog test need to be carried out independently and when the analog test is performed, the digital function needs to be kept in a predetermined state. For the reason, an influence upon the analog signal by the operation of the digital function cannot be tested, which is a problem to be solved.

SUMMARY OF THE INVENTION

The present invention has been made to solve at least one of the afore-mentioned problems that the prior art has had. It is an object of the present invention to provide a semiconductor integrated circuit device and an adjustment method of a semiconductor integrated circuit device capable of adjusting an analog signal without outputting the analog signal to the external in a form of an analog value wherein an analog signal to be adjusted is outputted from an analog signal generating section such as an internal power source circuit or the like built in the semiconductor integrated circuit device.

To achieve the object, according to one aspect of the present invention, there is provided a semiconductor integrated circuit device comprising: an analog signal generating section for outputting an analog signal; and a predetermined signal storing section for storing at least one predetermined signal that is supplied to the analog signal generating section and sets the analog signal to a predetermined value, wherein digital signals are used for input/output interface to external terminals, for adjusting the analog signal, the semiconductor integrated circuit device further comprises a judgment section for outputting at least one judgment signal that corresponds to a comparison result of the analog signal corresponding to at least one adjustment signal and the predetermined value generated based on power source voltage, for each adjustment signal supplied to the analog signal generating section in accordance with a test signal, and in case the judgment signal judges that the analog signal has the predetermined value, the adjustment signal corresponding to the as-judged analog signal is stored in the predetermined signal storing section as the predetermined signal.

In the semiconductor integrated circuit device directed to the one aspect of the present invention, when an analog signal is adjusted for the analog signal generating section build in a semiconductor integrated circuit device wherein digital signals are used for input/output interface to external terminals, at least one adjustment signal is supplied for generating an analog signal. The judgment section compares the generated analog signal with the predetermined value generated based on power source and output the comparison result in a form of at least one judgment signal. The predetermined signal storing section stores an adjustment signal that adjusts an analog value to a predetermined value in accordance with at least one judgment signal in a form of a predetermined signal.

Furthermore, there is provided an adjustment method of the semiconductor integrate circuit device, directed to the one aspect of the present invention, there is provided an adjustment method of a semiconductor integrated circuit device that generates an analog signal having a predetermined value based on at least one predetermined signal stored and uses digital signals for input/output interface to external terminals, for adjusting the analog signal, the adjustment method comprising the steps of: a signal generating step for generating the analog signal that corresponds to at least one adjustment signal; a judgment step for judging a comparison result of the analog signal generated and the predetermined value generated based on power source voltage, the judgment step being executed inside the semiconductor integrated circuit device; and a storing step for storing the adjustment signal as the predetermined signal in case the analog signal is judged as having the predetermined value through the judgment step.

In the adjustment method of the semiconductor integrated circuit device directed to the one aspect of the present invention, when an analog signal is adjusted for the analog signal generating section build in a semiconductor integrated circuit device wherein digital signals are used for input/output interface to external terminals, an analog signal corresponding to at least one adjustment signal is generated in the signal generating step, and in the judgment step, an analog signal generated and the predetermined value generated based on power source voltage are compared inside the semiconductor integrated circuit device. In the storing step, at least one adjustment signal is stored as at least one predetermined signal in case the analog signal is judged as having the predetermined value.

Since the judgment section or the judgment step is provided, an analog signal outputted for each adjustment signal and the predetermined value can be compared. Thereby, judgment of analog signal can be executed inside the semiconductor integrated circuit device.

That is, it is not necessary to output an analog signal to the external terminal of the semiconductor integrated circuit device. Furthermore, it is not necessary to arrange an output dedicated external terminal for an analog signal and wiring for an analog signal to the output dedicated external. Thereby, consideration for analog wiring is not necessitated and this contributes to simplification of design process of an semiconductor integrated circuit device.

Furthermore, since an analog signal is not outputted from the external terminal, a test for an analog signal is not required. That is, there may be arranged a tester device having digital function for a digital-interface-type external terminal. It is not necessary to provide a complicated tester device that has both digital function and analog function. Furthermore, the inventive semiconductor integrated circuit device does not require system to switch test condition between digital function and analog function, whereby overhead of test time due to switching operation. Reduce of test cost thus can be realized.

It should be noted that the predetermined value herein is a value for a comparison judgment of an analog signal as well as an analog value. The predetermined value can be generated based on power source voltage that is supplied to the semiconductor integrated circuit device at the time of adjustment test. Once power source voltage is set as the predetermined voltage value for adjustment test, it is not necessary to input a predetermined analog value from an external terminal as predetermined value. A predetermined value can be generated by appropriately lowering/dividing power source voltage or appropriately combining those resultant voltages.

Furthermore, it is preferable that the predetermined value is a predetermined analog value region between a first comparison reference value and a second comparison reference value and the judgment signal judges which analog value region sectioned by two or more comparison reference values including the first and the second comparison reference values the analog signal exists in. Thereby, fluctuation of the analog signal from the predetermined value can be grasped and depending on judgment result, at least one adjustment signal can be fluctuated to make the analog signal approximate the predetermined value immediately.

It is preferable that the judgment section includes a plurality of comparing sections for comparing the analog signal with each of the two or more comparison reference values, and an encoding section for outputting encoding signals in a manner of receiving output signals from the plurality of comparing sections and discriminating the analog value region where the analog signal exists. As encoding signals, the encoding section may output digital signals that have a minimum essential number of bits being enough to discriminate analog value regions.

Furthermore, according to another aspect of the present invention, there is provided a semiconductor integrated circuit device comprising: an analog signal generating section for outputting an analog signal; and a predetermined signal storing section for storing at least one predetermined signal that is supplied to the analog signal generating section and sets the analog signal to a predetermined value, wherein digital signals are used for input/output interface to external terminals, and the semiconductor integrated circuit device further comprises virtual load section for varying load against the analog signal in response to a load setting signal to be supplied. Still further, there is provided an adjustment method of the semiconductor integrate circuit device, directed to the another aspect of the present invention, there is provided an adjustment method of a semiconductor integrated circuit device that generates an analog signal having a predetermined value based on at least one predetermined signal stored and uses digital signals for input/output interface to external terminals, the adjustment method adjusting the analog signal through a virtual load step for varying load against the analog signal in accordance with a load setting signal. Since there is provided the virtual load section or the virtual load step, virtual load can be connected appropriately. Various operation states inside a semiconductor integrated circuit device such as digital function and other analog function can be reproduced like a simulation. This adjustment method may be applied to a test for analog signal adjustment so that analog signal adjustment can be conducted under load condition close to actual operation.

The above and further objects and novel features of the invention will more fully appear from the following detailed description when the same is read in connection with the accompanying drawings. It is to be expressly understood, however, that the drawings are for the purpose of illustration only and are not intended as a definition of the limits of the invention.

DETAILED DESCRIPTION OF THE PREFERRED EMBODIMENTS

Figure 1:
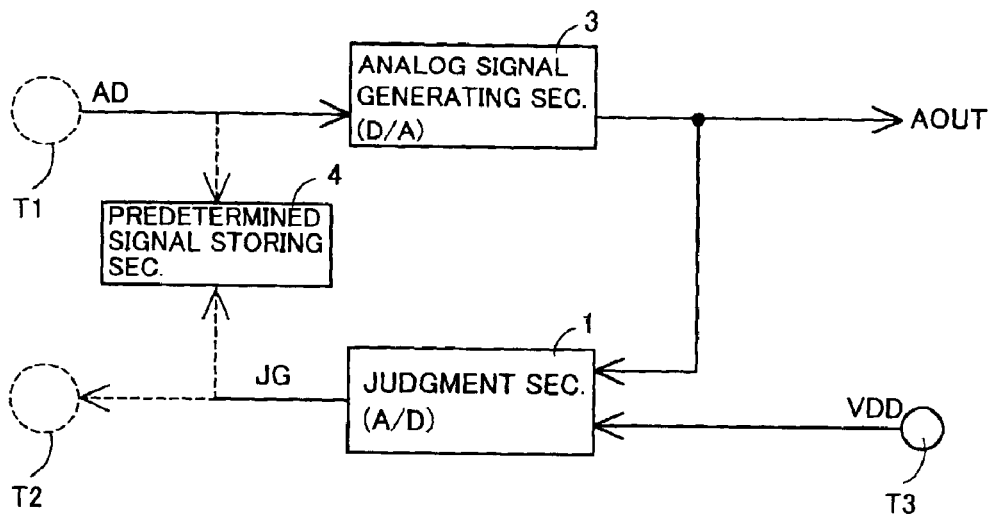
FIG. 1 is a first principle diagram of the present invention.

FIG. 1 shows a first principle diagram of the present invention. An analog signal AOUT is outputted from an analog signal generating section 3 in which an adjustment signal AD is inputted. If the adjustment signal AD is digital signal, the analog signal AOUT is outputted from the digital signal by the analog signal generating section 3 and input-output signal is subjected to D/A conversion by the analog signal generating section 3. If the adjustment signal AD is digital signal, the adjustment signal AD may be inputted from an external terminal T1. Contrary to this, an analog signal AOUT is a signal used in the semiconductor integrated circuit device and never outputted as an analog signal from an external terminal.

The analog signal AOUT is inputted to a judgment section 1 and compared with a predetermined value for judgment. The predetermined value is a reference value for comparison and judgment and needs to be kept at a predetermined fixed value. A judgment section 1 generates a judgment signal based on the power source voltage VDD supplied to an external terminal T3. In a test operation including adjustment of the analog signal, the power source voltage VDD supplied to the semiconductor integrated circuit device can be kept at a predetermined voltage value when it is supplied. Therefore, the predetermined value can be generated based on the power source voltage VDD supplied to the external terminal T3. The power source voltage VDD needs to be always supplied so as to operate the semiconductor integrated circuit device. By using the power source voltage VDD, the predetermined value can be generated without supplying any analog signal from the external terminal.

The judgment signal JG is outputted from the judgment section 1. This judgment signal JG may be made to act on a predetermined signal storing section 4 as an internal signal of the semiconductor integrated circuit device and further, may be outputted through an external terminal T2. If the judgment signal JG is made to act on the predetermined signal storing section 4, the adjustment signal AD is fetched into the predetermined signal storing section 4 based on the judgment signal JG. If the judgment signal is outputted from the external terminal T2, the judgment signal JG is digital signal. An outputted judgment signal JG is inputted to a control section (not shown) outside such as a tester device. The external control section acquires the adjustment signal AD at this time based on the judgment signal JG and terminates the adjustment test operation at the same time. Then, the external control section stores an acquired adjustment signal as a predetermined signal prior to or after the termination of the adjustment test operation. If a digital signal JG is outputted corresponding to the analog signal AOUT to be inputted to the judgment section 1, the input-output signal is subjected to A/D conversion at the judgment section 1.

The predetermined signal storing section 4 can be constituted of electrically rewritable memory elements regardless of volatile or nonvolatile, by a circuit structure having data holding function such as a register, flip-flop. Further, a fuse element, a 1-time ROM or the like which enables write of only a single time may be used. The fuse element may be cut out electrically in addition to cutting with laser radiation or the like. Here, the electric processing may be controlled within the semiconductor integrated circuit device or by any external control section.

Figure 2:
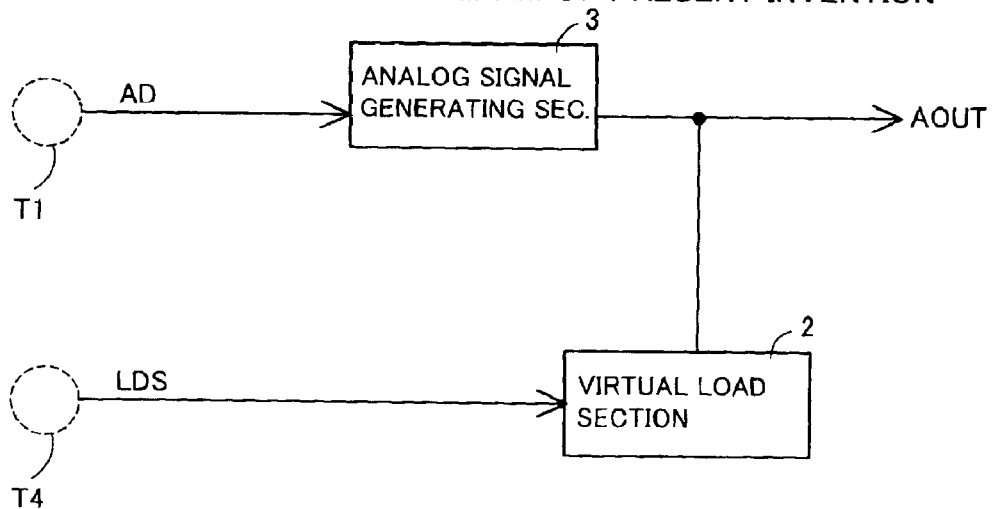
FIG. 2 is a second principle diagram of the present invention.

FIG. 2 shows a second principle diagram of the present invention. The analog signal generating section 3 outputs an analog signal AOUT corresponding to the adjustment signal AD. A virtual load section 2 is connected to the analog signal AOUT. The virtual load section 2 can change a load connected to the analog signal AOUT under a control by the load setting signal LDS. If the load setting signal LDS is set up appropriately, a similar load to a load applied to the analog signal AD can be connected falsely under each operation state of the semiconductor integrated circuit device. If the load setting signal LDS is set up when the analog signal AOUT is adjusted according to the adjustment signal AD, the analog signal AOUT can be judged by connecting a similar load to actual operation without actuating the semiconductor integrated circuit device.

Here, it may be so constructed that the adjustment signal AD and the load setting signal LDS is generated within the semiconductor integrated circuit device or inputted from outside through the external terminal T1, T4. If the adjustment signal AD and the load setting signal LDS are inputted from outside through the external terminal T1, T4, these signals are digital signals.

Hereinafter, the first to fourth embodiments of the semiconductor integrated circuit device and adjustment method of the semiconductor integrated circuit device of the present invention will be described in detail with reference to drawings of FIGS. 3–16. The first to fourth embodiments adopt such a circuit structure in which an internal power source circuit 31 is provided as the analog signal generating section 3 and the internal power source voltage VII is outputted as the analog signal AOUT.

Figure 3:
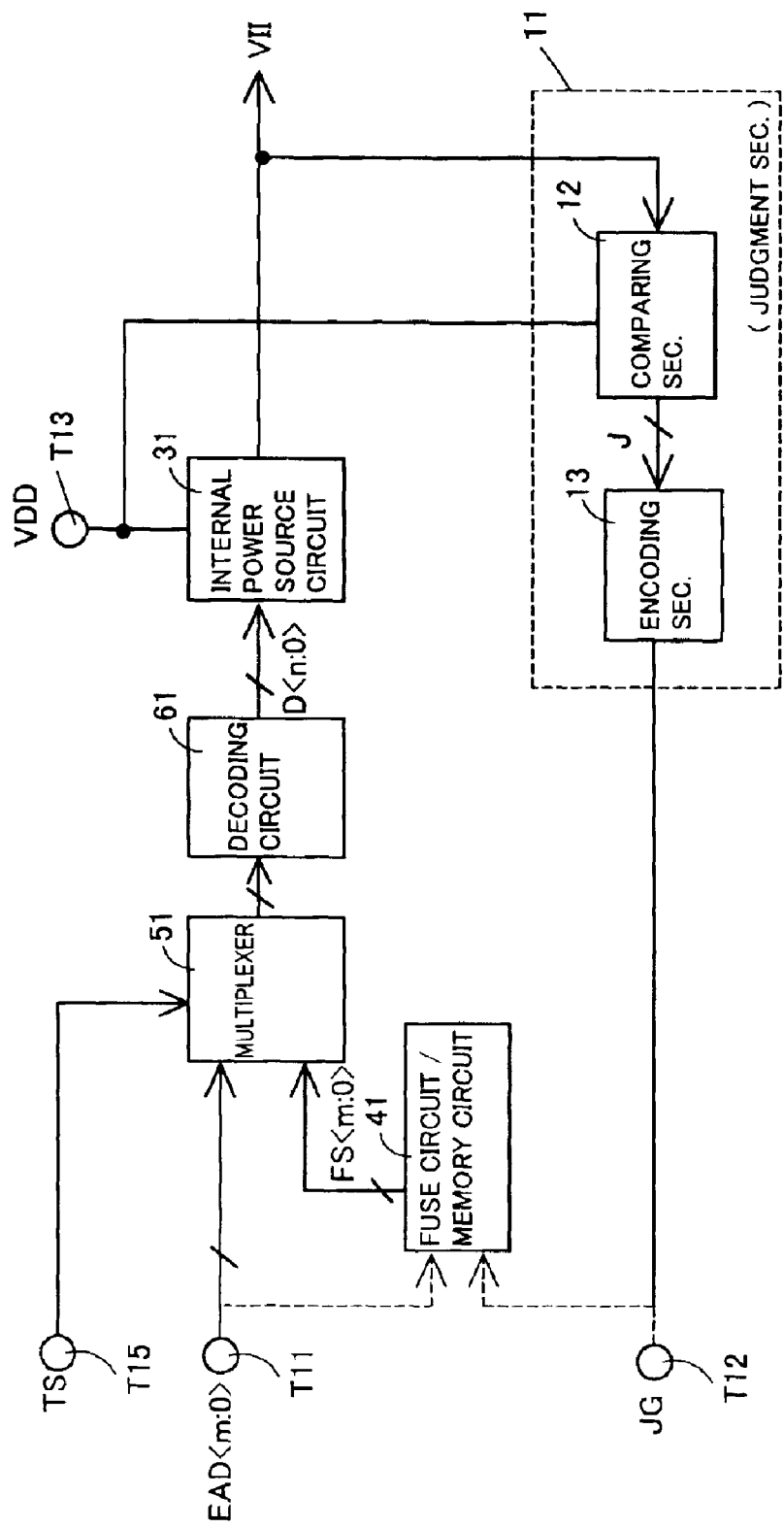
FIG. 3 is a circuit block diagram of a first embodiment.

FIG. 3 shows a circuit block diagram of the first embodiment for adjustment of the internal power source voltage VII. An adjustment signal EAD<m:0> to be inputted from an external terminal T11 is inputted to one input terminal of a multiplexer 51. A predetermined signal FS<m:0>, which is to be stored in a fuse circuit (or memory circuit) 41, is inputted to the other input terminal of the multiplexer 51. The multiplexer 51 is controlled by a test signal TS inputted to the external terminal T15. In adjustment test for the internal power source voltage VII, the adjustment signal EAD<m:0> is selected. In a normal state after the adjustment signal is stored in the fuse circuit (or memory circuit) 41 after the adjustment test is completed, the predetermined signal FS<m:0> is selected. The selected signal EAD<m:0> or FS<m:0> is decoded by a decoding circuit 61. A decoding signal D<n:0> outputted from the decoding circuit 61 is inputted to the internal power source circuit 31.

The internal power source voltage VII outputted from the internal power source circuit 31 is inputted to a comparing section 12 in the judgment section 11. Further, the power source voltage VDD supplied to the external terminal T13 is inputted to the comparing section 12. The comparing section 12 sets up a predetermined value based on the power source voltage VDD. A comparison result signal J from the comparing section 12 is inputted to the encoding section 13. Then, the encoding section 13 judges a comparison result and the judgment signal JG is outputted.

For storage of the adjustment signal EAD<m:0> to the fuse circuit (or memory circuit) 41, a case where it is controlled within the semiconductor integrated circuit device and a case where it is controlled by an external control device (not shown) such as a tester device can be considered. If it is controlled internally, the judgment signal JG is inputted to the fuse circuit (or memory circuit) 41 as a control signal and by blowing of the fuse element based on the judgment signal JG or writing operation into the memory element, the adjustment signal EAD<m:0> is fetched in. If it is controlled from outside, the judgment signal JG is digital signal and outputted from the external terminal T12. By blowing of the fuse element from outside or writing operation into the memory element based on the outputted judgment signal JG, the adjustment signal EAD<m:0> is stored. When it is also controlled internally, it is permissible to output the judgment signal JG from the external terminal T12 as digital signal. In this case, it is possible to notify of completion of the adjustment test operation with the judgment signal JG and stop supply of the test signal TS and adjustment signal EAD<m:0>.

If the test signal TS inputted from the external terminal T15 is activated, the adjustment signal EAD<m:0> is inputted from the external terminal T11 every predetermined cycle. The inputted adjustment signal EAD<m:0> is decoded to a decoding signal D<n:0> by the decoding circuit 61 through the multiplexer 51 and inputted to the internal power source circuit 31. The internal power source circuit 31 outputs the internal power source voltage VII corresponding to the decoding signal D<n:0>. The outputted internal power source voltage VII is inputted to the comparing section 12 in the judgment section 11 and compared with a predetermined value generated based on the power source voltage VDD. The comparison result signal J is inputted to the encoding section 13. The encoding section 13 judges a comparison result so as to output the judgment signal JG. If it is judged that the judgment signal JG does not coincide with the predetermined value of the internal power source voltage VII, the adjustment signal EAD<m:0> is updated after a predetermined cycle and inputted and then, the comparison judgment operation is repeated. If it is judged that the judgment signal JG coincides with the predetermined value of the internal power source voltage VII, the adjustment signal EAD<m:0> produced as a result of the judgment on that coincidence is stored in the fuse circuit (or memory circuit) 41 by internal control or external control depending on setting of the semiconductor integrated circuit device.

Figure 4:
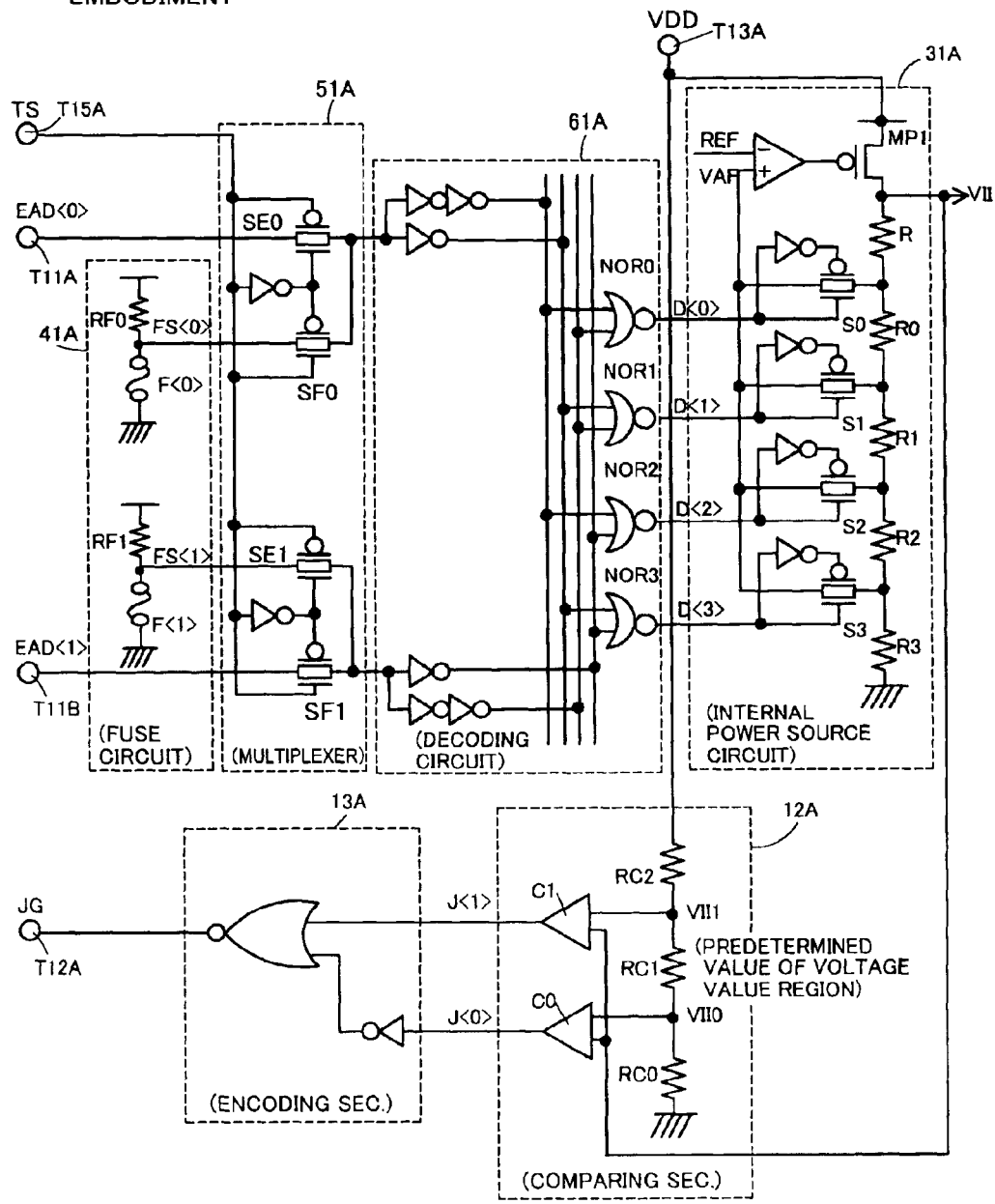
FIG. 4 is a circuit diagram of a specific example directed to the first embodiment.

FIG. 4 shows a specific circuit diagram of the first embodiment. This Figure indicates that 2-bit signal (m=1) is inputted from the external terminals T11A, T11B as the adjustment signal EAD <1:0>. The fuse circuit 41A stores the predetermined signal FS<1:0> at a connection point between a resistance element connected to the power source voltage and the fuse element F<1:0> connected to the ground voltage. If the fuse element F<1:0> is not cut out, a low level signal is stored and if it is cut out, a high level signal is stored.

The multiplexer 51A selects either one of the adjustment signal EAD<1:0> and the predetermined signal FS<1:0>. Transfer gates SE0, SE1 and SF0, SF1 are provided between each signal path and the output terminal. Each transfer gate is supplied with electricity and controlled by a test signal TS inputted from the external terminal T15A. The transfer gates SE0, SE1 and the transfer gates SF0, SF1 are controlled exclusively from each other because the connecting relations of the transfer gates SE0, SE1 and the transfer gates SF0, SF1 are reverse to each other. The transfer gates SE0, SE1 are supplied with electricity by a low level signal of the test signal TS so that the predetermined signal EAD <1:0> is selected. The transfer gate SF0, SF1 are supplied with electricity by a high level signal of the test signal TS so that the predetermined signal FS<1:0> is selected. The adjustment test operation for the internal power source voltage VII is carried out by a low level signal of the test signal TS.

The two-bit signals selected by the multiplexer 51A are inputted to the decoding circuit 61A. After that signals are inputted, signals of the in-phase and anti-phase are generated for each bit. Four types of decoding are carried out corresponding to combinations of the respective signals. That is, if the adjustment signals EAD<1:0> are taken as an example, decoding signals D<0>–D<3> are selected successively to (EAD<1>, EAD<0>)=(0, 0), (0, 1), (1, 0), (1, 1) by NOR-gate NOR0–NOR3 so as to produce high level signals.

The internal power source circuit 31A outputs the internal power source voltage VII from a connection point between the PMOS transistor MP1 and the resistance element array of R, R0–R3. The gate terminal of the PMOS transistor MP1 is controlled by an operation amplifier. The reference voltage VREF is inputted to a reverse-input terminal of the operation amplifier from the reference terminal REF. A feedback loop is constructed between the non-inverting input terminal and the output terminal of the internal power source voltage VII. A fed-back feedback voltage VAF is inputted to the non-inverting input terminal. The transfer gates S0–S3 for connecting between each connection point of the resistance element array of R, R0–R3 and the non-inverting input terminal are selected corresponding to the decoding signals D<0>–D<3> so as to form a feedback loop. The internal power source circuit 31A is a non-inverting amplification circuit having a predetermined amplification rate which is determined by a feedback position in the resistance element array of R, R0–R3.

In this feedback loop, depending on switching of the decoding signals D<0>–D<3> accompanied by switching of the adjustment signals EAD<1:0>, each of the transfer gates S0–S3 is turned ON successively. The feedback positions in the resistance element array of R, R0–R3 are shifted to low voltage side successively so as to increase the amplification rate. The internal power source voltage VII is raised successively so as to obtain an output voltage value.

The internal power source voltage VII is inputted to the comparing section 12A. The comparing section 12A contains two comparators C0, C1. Reference voltages VII0, VII1 of the respective comparators C0, C1 are obtained by dividing the power source voltage VDD inputted from the external terminal T13A with resistance elements RC0–RC2. Here, a voltage value region between the reference voltage VII0 and VII1 is a predetermined value. If the internal power source voltage VII is inputted to each of the comparators C0, C1, comparison of voltage with the predetermined value is carried out. If the internal power source voltage VII is in a lower voltage value region than VII0 and if in a higher voltage value region than VII1, the comparison signals J<0>, J<1> outputted from each of the comparators C0, C1 are of the in-phase. If the comparison signals are in a voltage value region between the reference voltages VII0 and VII1, the comparison signals J<0>, J<1> are of anti-phase.

The encoding section 13A, which encodes the comparison signals J<0>, J<1> so as to output the judgment signal JG, inverts the comparison signal J<0> logically and acquires NOR logic between the comparison signal J<1> and J(C). If the internal power source voltage exists in a voltage value region between the reference voltages VII0 and VII1 as described above, the comparison signals J<0>, J<1> are of the anti-phase and input signals to the NOR gate become low level. Therefore, in this case, a high level signal is outputted as the judgment signal JG and it is determined that the internal power source voltage VII is a predetermined value. Because the judgment signal JG outputted from the encoding section 13A is digital signal, it can be outputted from a external terminal T12A. The judgment section is constituted of the comparing section 12A and the encoding section 13A.

Figure 5:
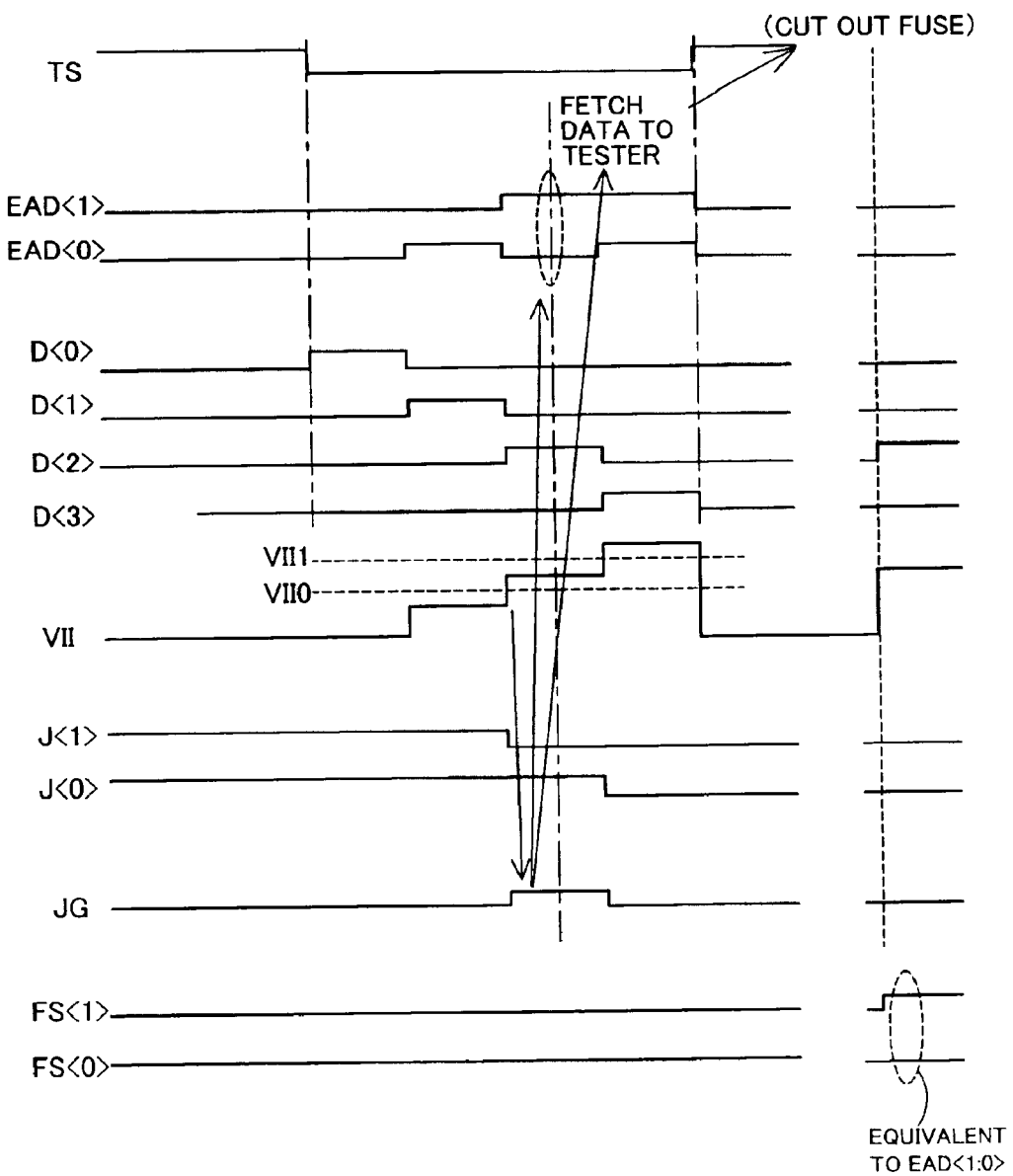
FIG. 5 shows operational waveform of the specific example directed to the first embodiment.

FIG. 5 shows an operation waveform in a specific example of the first embodiment. If the test signal TS is inverted to low level, the adjustment test on the internal power source voltage VII is started. With this state, the adjustment signals EAD <1:0> are incremented successively from a logical level of (0, 0). Because the adjustment signals EAD<1:0> are selected by the multiplexer 51A corresponding to the test signal TS, each of the decoding signals D<0>–D<3> is selected successively to produce high level signal. The amplification rate of the internal power source circuit 31A is increased corresponding to selection of the decoding signals D<0>–D<3>. Therefore, the internal power source voltage VII is increased successively.

Because the internal power source voltage VII is smaller than the reference voltage VII0 of the comparing section 12A when the decoding signal D<0> and D<1> is selected, the comparison signals J<0>, J<1> are of high level. Because the internal power source voltage VII is larger than the reference voltage VII1 of the comparing section 12A when the decoding signal D<3> is selected, the comparison signals J<0>, J<1> are of low level. In either case, one input terminal of the NOR gate of the encoding section 13A becomes high level. Therefore, the judgment signal JG keeps low level.

When the decoding signal D<2> is selected, the internal power source voltage VII is located between the reference voltages VII0 and VII1 of the comparing section 12A. Thus, the comparison signal J<0> is of high level while the J<1> is low level. The input terminals of the NOR gate of the encoding section 13A become low level. Therefore, the judgment signal JG becomes high level.

The adjustment signals EAD<1:0> at this time are memorized in an external control section by the judgment signal JG outputted from the external terminal T12A. After the test signal TS is inverted to high level and the adjustment test is terminated, a predetermined fuse element in a fuse circuit 41A is cut out. More specifically, the fuse element F<1> is cut out in order to store the adjustment signals (EAD<1>, EAD<0>)=(1, 0). Consequently, the adjustment signals (EAD<1>, EAD<0>)=(1, 0) are stored in the fuse circuit 41A as the predetermined signals (FS<1>, FS<0>)=(1, 0).

Figure 6:
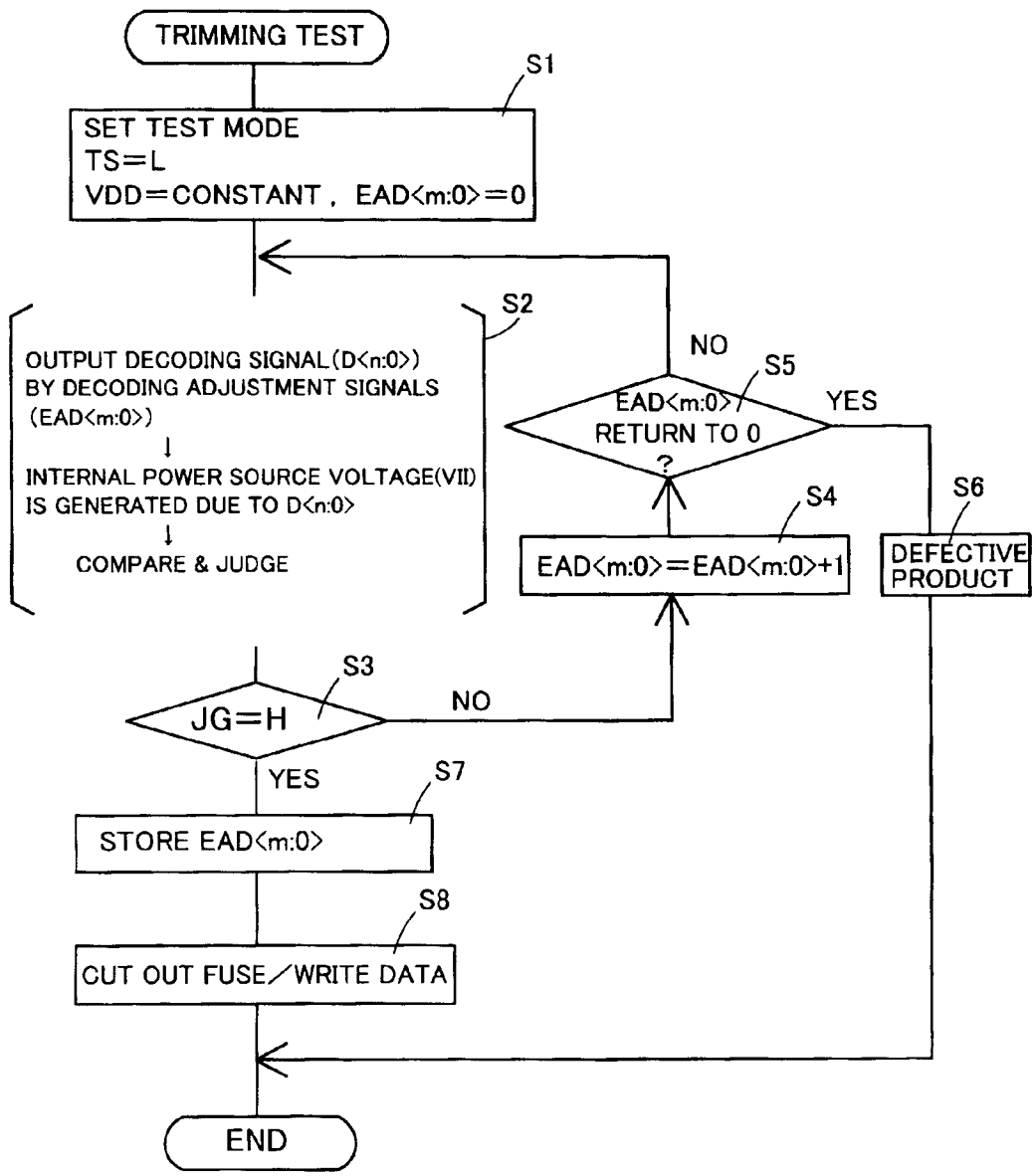
FIG. 6 is a trimming test flow of the first embodiment.

FIG. 6 shows a test flow for a case where a predetermined signals FS<m:0> are stored by executing a trimming test on the internal power source voltage VII using a tester device as an external control section. A portion surrounded by the parentheses in FIG. 6 indicates processing within the semiconductor integrated circuit device.

Test mode is set up in a tester device when the trimming test is started (S1). Consequently, the test signal TS is inverted to low level and at the same time, the power source voltage VDD is fixed to a predetermined voltage value. Further, it is initialized to the adjustment signals EAD<m:0>=0. With this state, the adjustment signals EAD<m:0> are supplied successively to the external terminal of the semiconductor integrated circuit device. The adjustment signals EAD<m:0> are decoded in the semiconductor integrated circuit device so as to output one of decoding signals D<n:0> and correspondingly, the internal power source voltage VII is outputted. The outputted internal power source voltage VII is compared for judgment (S2).

As a result of the judgment, the judgment signal JG, which is digital signal outputted from the external terminal, is judged (S3). If a low level is maintained (S3: NO), it means that the internal power source voltage VII is not a predetermined value. Therefore, the adjustment signals EAD<m:0> are incremented by one and updated (S4). If the incremented adjustment signals EAD<m:0> are not zero which is an initial value (S5: NO), a new adjustment signals EAD<m:0> is supplied to the external terminal and the processing after S2 is repeated. If the updated adjustment signals EAD<m:0> return to the initial value 0 (S5: YES), it means that in this semiconductor integrated circuit device, its internal power source voltage VII cannot be adjusted to the predetermined value and then it is determined that this is a defective product (S6).

If the judgment signal JG turns to a high level as a result of the judgment (S3: YES), it means that the internal power source voltage VII is a predetermined value. The value of the adjustment signals EAD<m:0> at this time are acquired as storage data into the fuse circuit (or memory circuit) 41 (S7). Based on this acquired data, the appropriate fuse elements are cut out (or the adjustment signals EAD<m:0> are fetched in).

Figure 7:
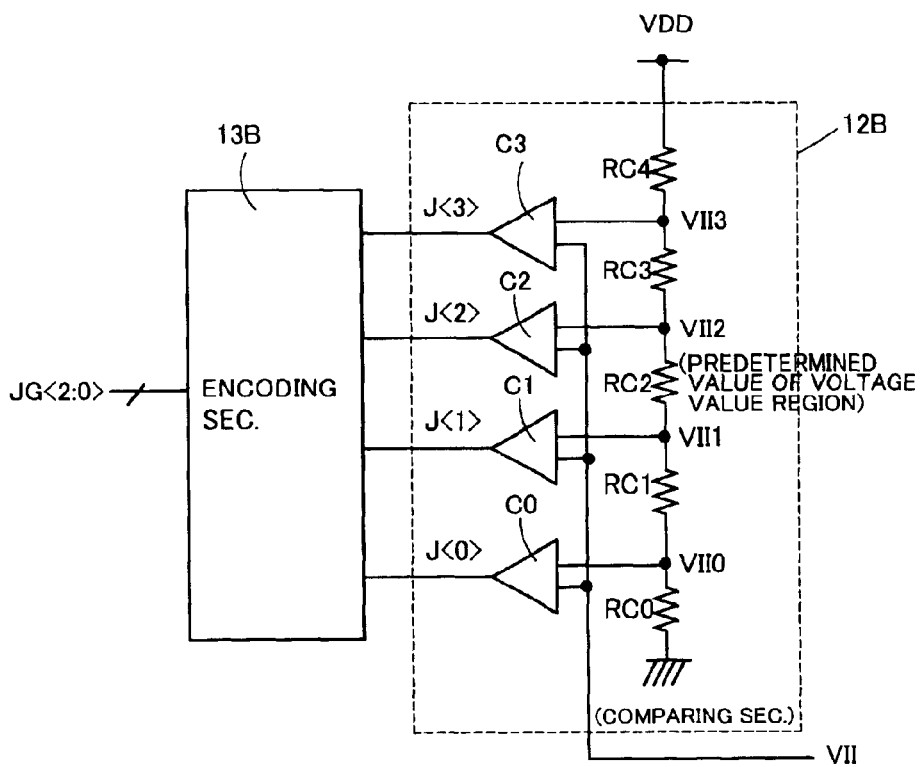
FIG. 7 is a circuit diagram of a variant of a judgment section.

FIG. 7 shows a modification of the judgment section. The comparing section 12B adds resistance elements RC3, RC4 and comparators C2, C3 to the comparing section 12A (see FIG. 4). The reference voltages of the respective comparators C0–C3 are reference voltages VII0, VII1, VII2, VII3 respectively. The reference voltages VII0–VII3 are obtained by dividing the power source voltage VDD inputted from the external terminal by resistance elements RC0–RC4. If the voltage value region between the reference voltages VII1 and VII2 is set to a predetermined value, two voltage value regions exist each up and down. Five voltage value regions can be identified.

The comparing section 12B identifies in which voltage value region of those five regions the internal power source voltage VII exists. This identification is carried out when the comparison signals J<3:0> outputted from the respective comparators C0–C3 are set to "1" successively from the comparison signal J<0> to the comparison signal J<3>. The encoding section 13B encodes the comparison signals J<3:0> so as to output 3-bit judgment signals JG<2:0>. In an encoding table of FIG. 7, the judgment signals JG<2:0> are incremented as the comparison signals J<3:0> are increased. If the internal power source voltage VII exists in a predetermined voltage value region, (0, 0, 1, 1) is obtained as the comparison signals J<3:0>. At this time, (0, 1, 0) are outputted as the judgment signals JG<2:0>.

The judgment signals JG<2:0> have information about in which voltage value region the internal power source voltage VII exists if it exists in other voltage value region than the predetermined voltage value region. Thus, the voltage value region of the internal power source voltage VII can be grasped with the judgment signals JG<2:0>, so that transition of the adjustment signals can be brought near the predetermined signal more securely and rapidly. Although an example in which the judgment signals are 3-bit signals has been described in FIG. 7, this signal may be composed of more bits. Consequently, a more accurate voltage value region of the internal power source voltage VII can be grasped, so that the adjustment signals can be brought near the predetermined signals more rapidly.

Figure 8:
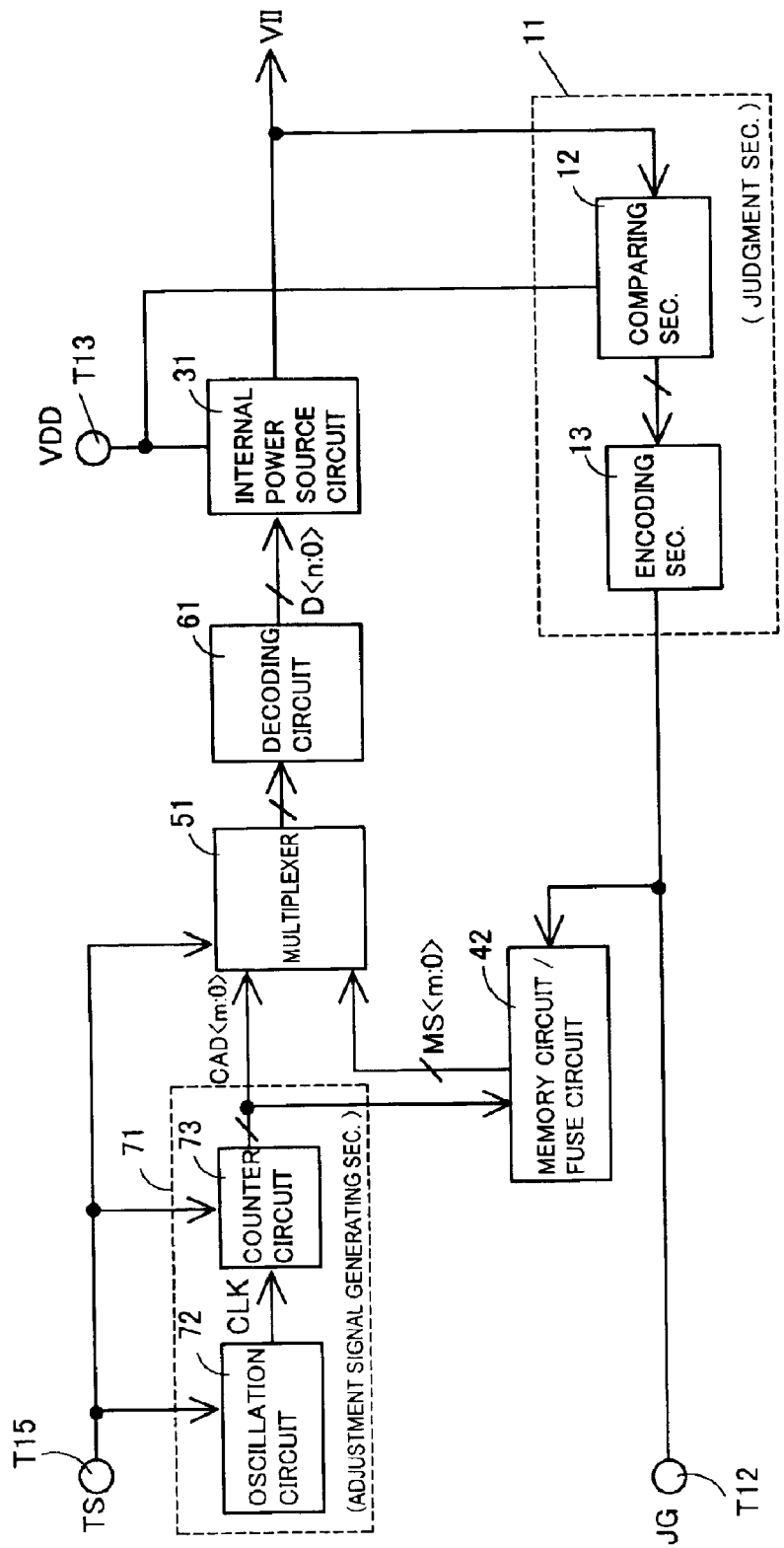
FIG. 8 is a circuit block diagram of a second embodiment.

FIG. 8 shows a circuit block diagram of the second embodiment about adjustment of the internal power source voltage VII. This circuit has a memory circuit (or fuse circuit) 42 instead of the fuse circuit (or memory circuit) 41 of the first embodiment (FIG. 3). Additionally, an adjustment signal generating section 71 is incorporated.

The adjustment signal generating section 71 comprises an oscillation circuit 72 and a counter circuit 73 in which an oscillation signal CLK from an oscillation circuit 72 is inputted. Further, the oscillation circuit 72 and the counter circuit 73 are controlled by the test signal TS inputted to the external terminal T15. The counter circuit 73 counts the oscillation signal CLK and outputs adjustment signals CAD<m:0> at every predetermined timing. Here, in order to count the predetermined timing, preferably, the oscillation signal CLK is divided or increment timing of the counter circuit 73 is subjected to adjustment or the like appropriately. Consequently, the adjustment signals CAD<m:0> are generated in the semiconductor integrated circuit device and therefore, the external terminals T11 (FIG. 3) for use for input of the adjustment signals EAD<m:0> are not required. As a result, the quantity of the external terminals for adjustment and test for the internal power source voltage VII can be reduced.

Storage of the adjustment signals CAD<m:0> into the memory circuit (or fuse circuit) 42 is controlled within the semiconductor integrated circuit device. The judgment signal JG is inputted to the memory circuit (or fuse circuit) 42 as a control signal and by writing operation into a memory element based on the judgment signal JG or by cutting of the fuse element, the adjustment signals CAD<m:0> are fetched in. In this case, the cutting of the fuses is performed by applying an electric stress. The stored signals are supplied as predetermined signals MS<m:0> at the time of normal operation.

In the meantime, although the judgment signal JG of this case is a signal for internal control, this signal may be outputted from an external terminal as digital signal. It is also possible to notify of completion of the adjustment test operation with the judgment signal JG and stop supply of the test signal TS from a tester circuit or the like.

Figure 9:
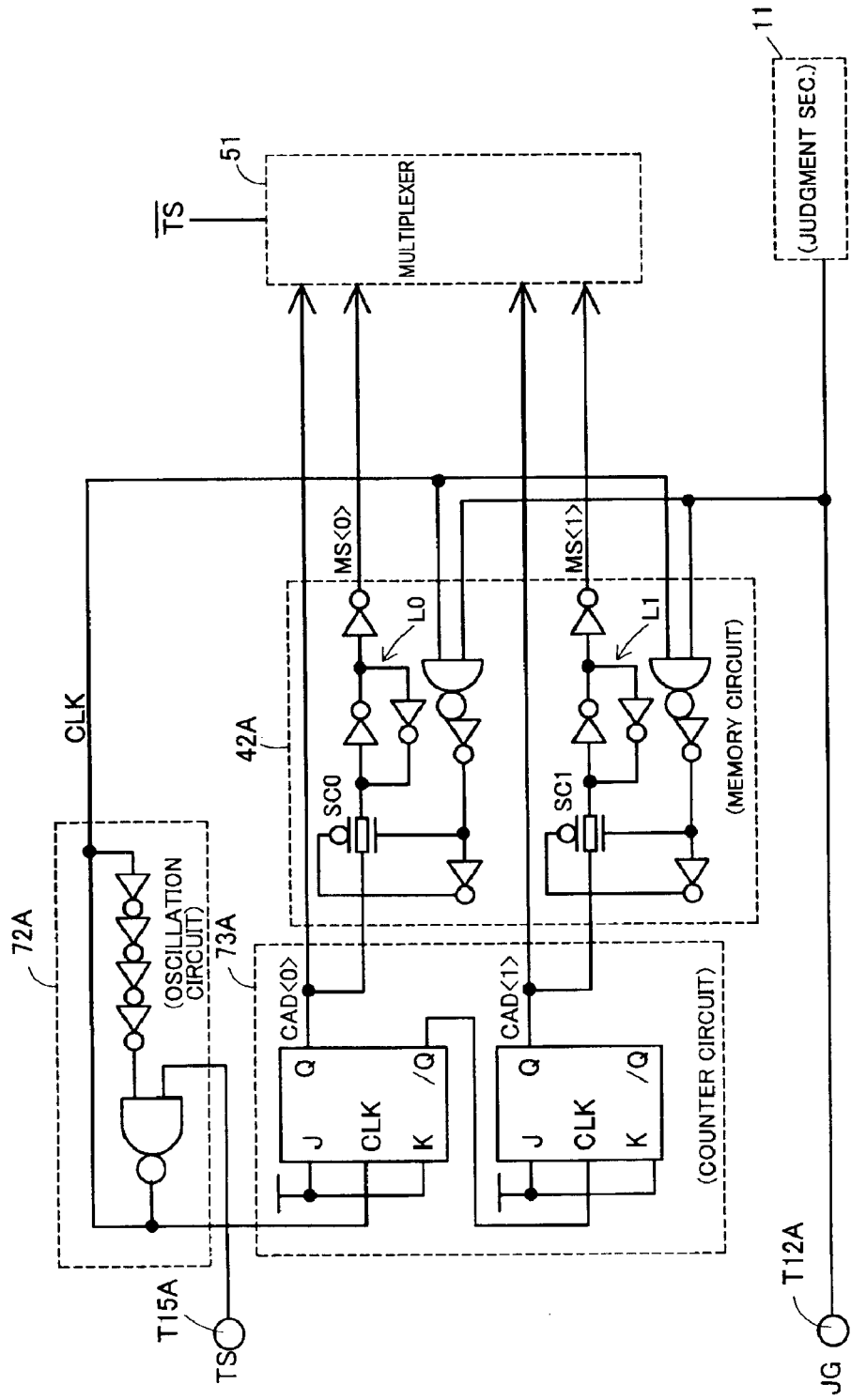
FIG. 9 is a circuit diagram of a specific example directed to the second embodiment.

FIG. 9 shows a major component circuit diagram according to a specific example of the second embodiment. This indicates a case where a 2-bit signals (m=1) are outputted as adjustment signals CAD <m:0> from the counter circuit 73A. In the oscillation circuit 72A, the test signal TS inputted from the external terminal T15A is inputted to an input terminal of the NAND gate as an enable signal. That is, the NAND gate is turned to logical inverting gate by the test signal TS and constitutes a ring oscillator together with an inverter gate array connected to the other input terminal.

The counter circuit 73A is a counter circuit in which flip-flop is cascade-connected. The oscillation signal CLK is inputted to a clock terminal (CLK) of the flip-flop of the lowest bit. Then, the adjustment signals CAD<1:0> are outputted from each flip-flop. The adjustment signals CAD<1:0> are supplied to the multiplexer 51 and at the same time to the memory circuit 42A.

The memory circuit 42A contains latch sections L0, L1 for each bit of the adjustment signals CAD<1:0> as a memory cell. The inputted adjustment signals CAD<1:0> are connected to the latch sections L0, L1 through the transfer gates SC0, SC1. The transfer gates SC0, SC1 are turned ON and controlled depending on a result of logical product operation between the oscillation signal CLK and the judgment signal JG. More specifically, when it is determined that the internal power source voltage VII is a predetermined value by the adjustment signals CAD<1:0> updated depending on the output of the oscillation signal CLK, a high level signal is outputted as the judgment signal JG. The transfer gates SC0, SC1 are turned ON by a logical product between the high-level judgment signal JG and the high level period of the oscillation signal CLK, so that the adjustment signals CAD<1:0> are stored in the latch sections L0, L1 of the memory circuit 42A. The adjustment signals CAD<1:0> stored in the latch section are supplied to the multiplexer 51 as the predetermined signals MS<1:0>.

Because a circuit structure not described in FIG. 9 of the specific example of the second embodiment is the same as the circuit structure of the specific example of the first embodiment (FIG. 4), description thereof is omitted. In this case, inverted signal of the test signal TS is inputted to the multiplexer.

Figure 10:
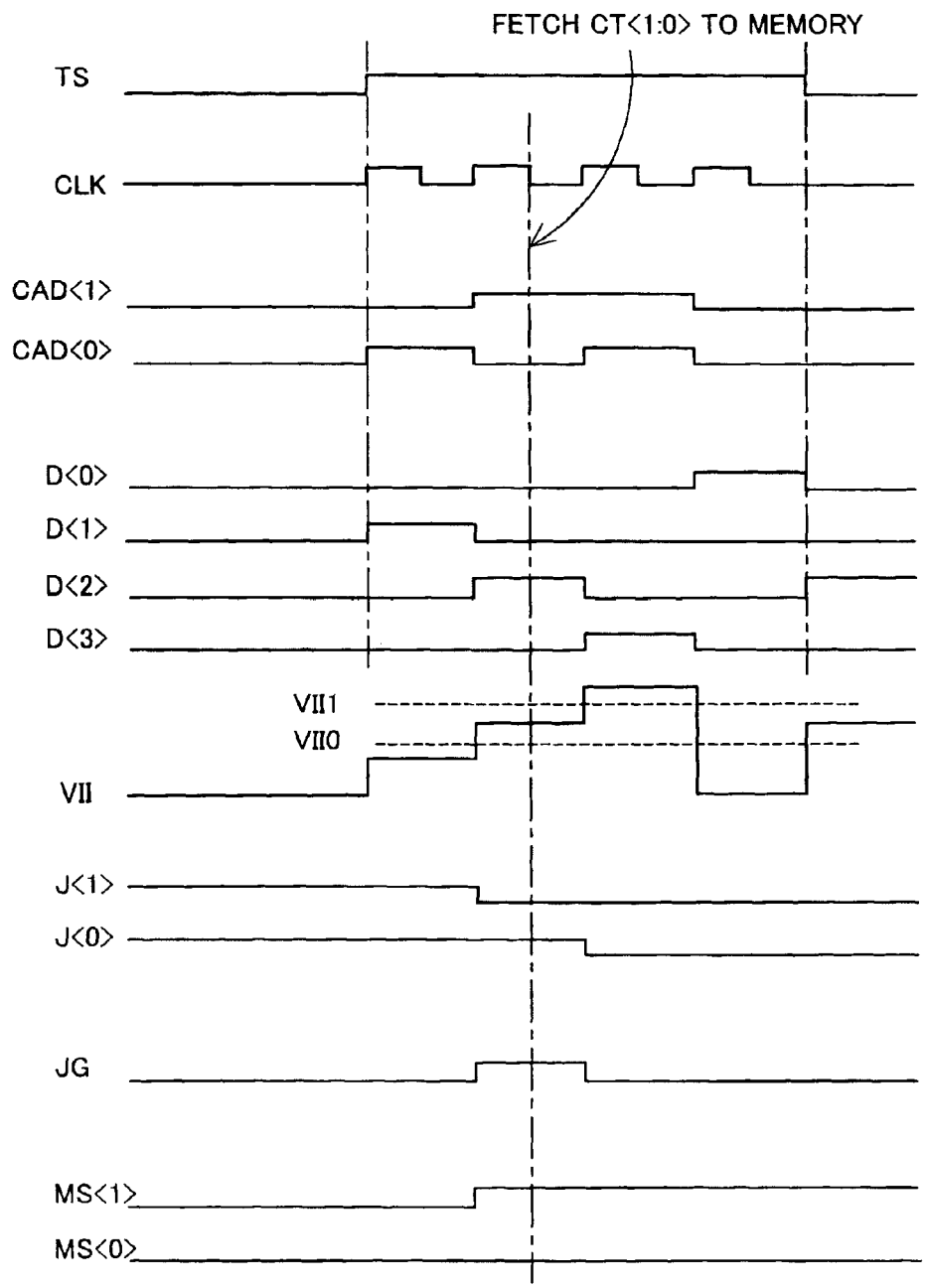
FIG. 10 shows operational waveform of the specific example directed to the second embodiment.

FIG. 10 shows an operation waveform according to a specific example of the second embodiment. If the test signal TS is inverted to a high level, adjustment test is started. The adjustment signals CAD<1:0> outputted from the counter circuit 73A at every cycle of the oscillation signal CLK are incremented. Such an operation that the decoding signals D<0>–D<3> are selected successively depending on the adjustment signals CAD<1:0> and the internal power source voltage VII is switched so as to output the comparison signals J<1:0> and the judgment signal JG is the same as the specific example of the first embodiment (FIG. 5). According to a specific example of the second embodiment, the adjustment signals CAD<1:0> are written into the memory circuit 42A based on transition of the judgment signal JG to a high level. The written adjustment signals CAD<1:0> are stored as the predetermined signals MS<1:0>.

According to the specific example of the second embodiment, when the judgment signal JG turns to a high level during the operation of the adjustment test with the test signal TS kept at a high level, the storage operation of the adjustment signals CAD<1:0> into the memory circuit 42A is carried out. FIG. 10 indicates a case where increment of the adjustment signals CAD<1:0> are continued after the adjustment signals CAD<1:0> are stored into the memory circuit 42A, so that the adjustment test is continued. It is permissible to construct that when the storage operation is completed, the test signal TS is transferred to a low level by outputting the judgment signal JG as digital signal from the external terminal T12A so as to terminate the adjustment test.

Figure 11:
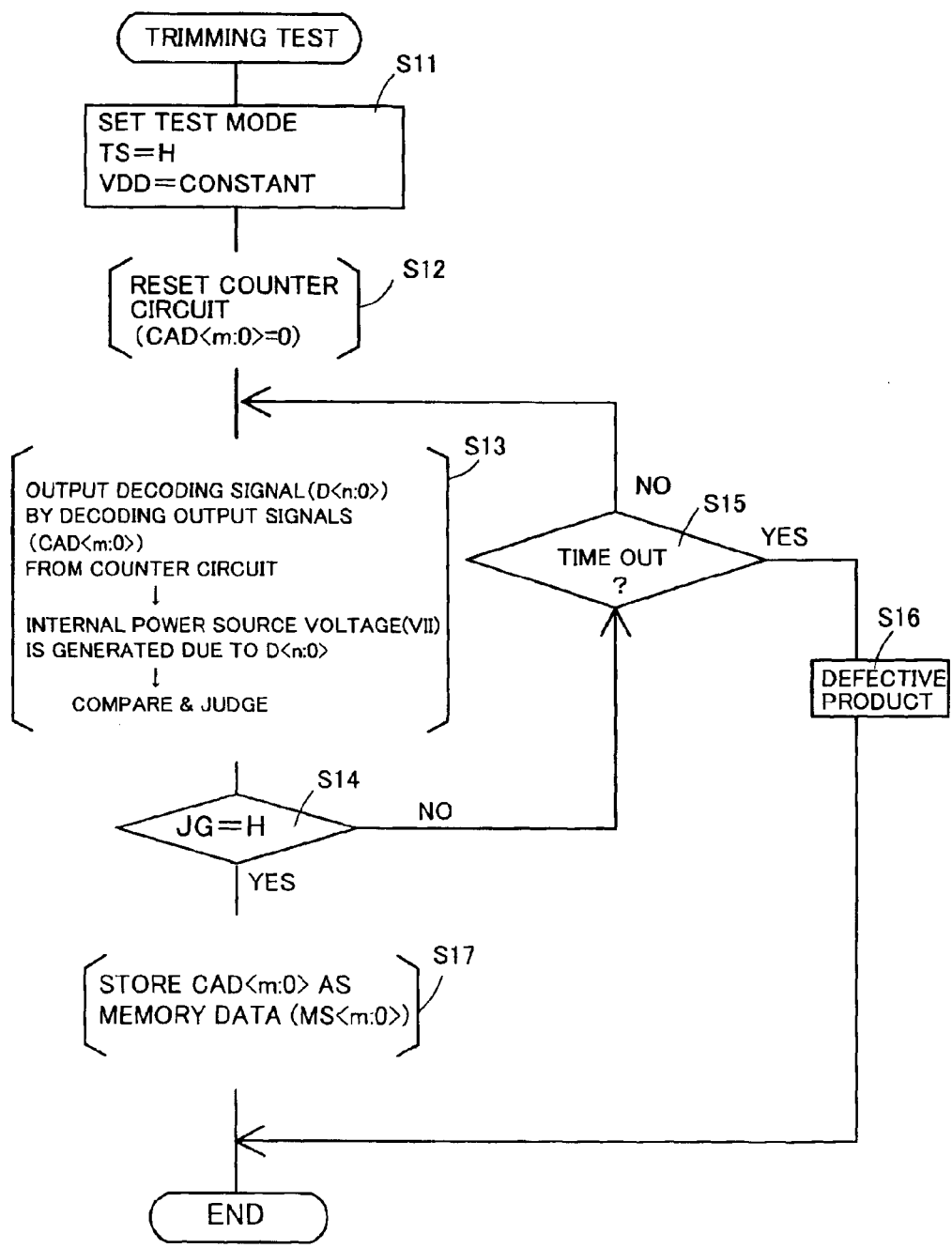
FIG. 11 is a trimming test flow of the second embodiment.

FIG. 11 shows a test flow of a case where trimming test is carried out for the internal power source voltage VII using an external tester device so as to store the predetermined signals MS<m:0>. A portion surrounded by the parentheses indicates processing within the semiconductor integrated circuit device.

After the trimming test is started, test mode is set up in the tester device (S11). Consequently, the test signal TS is inverted to a high level and the power source voltage VDD is fixed to a predetermined voltage value. In the semiconductor integrated circuit device which receives a high-level test signal TS, the counter circuit is reset so that the adjustment signals CAD<1:0> are initialized (S12). After that, the adjustment signals CAD<1:0> which are output signals from the counter circuit is decoded by a decoding signals D<n:0> and then, the internal power source voltage VII is outputted. Further, comparison with the predetermined value and judgment is carried out (S13).

If the judgment signal JG which is digital signal outputted from the external terminal keeps low level as a result of judgment (S14: NO), unless time-out is reached after time-out of the adjustment test is detected (S15: NO), comparison and judgment about the internal power source voltage VII accompanying increment operation of the adjustment signals CAD<1:0> within the semiconductor integrated circuit device are continued. If the time-out is reached (S15: YES), it is determined that this semiconductor integrated circuit device is a defective product (S16).

If the judgment signal JG turns to a high level as a result of the judgment (S14: YES), the adjustment signals CAD<1:0> are stored as memory data in the semiconductor integrated circuit device (S17). The stored data is the predetermined signals MS<1:0>. At this time, the tester device may invert the test signal TS to a low level and terminate the adjustment test.

Figure 12:
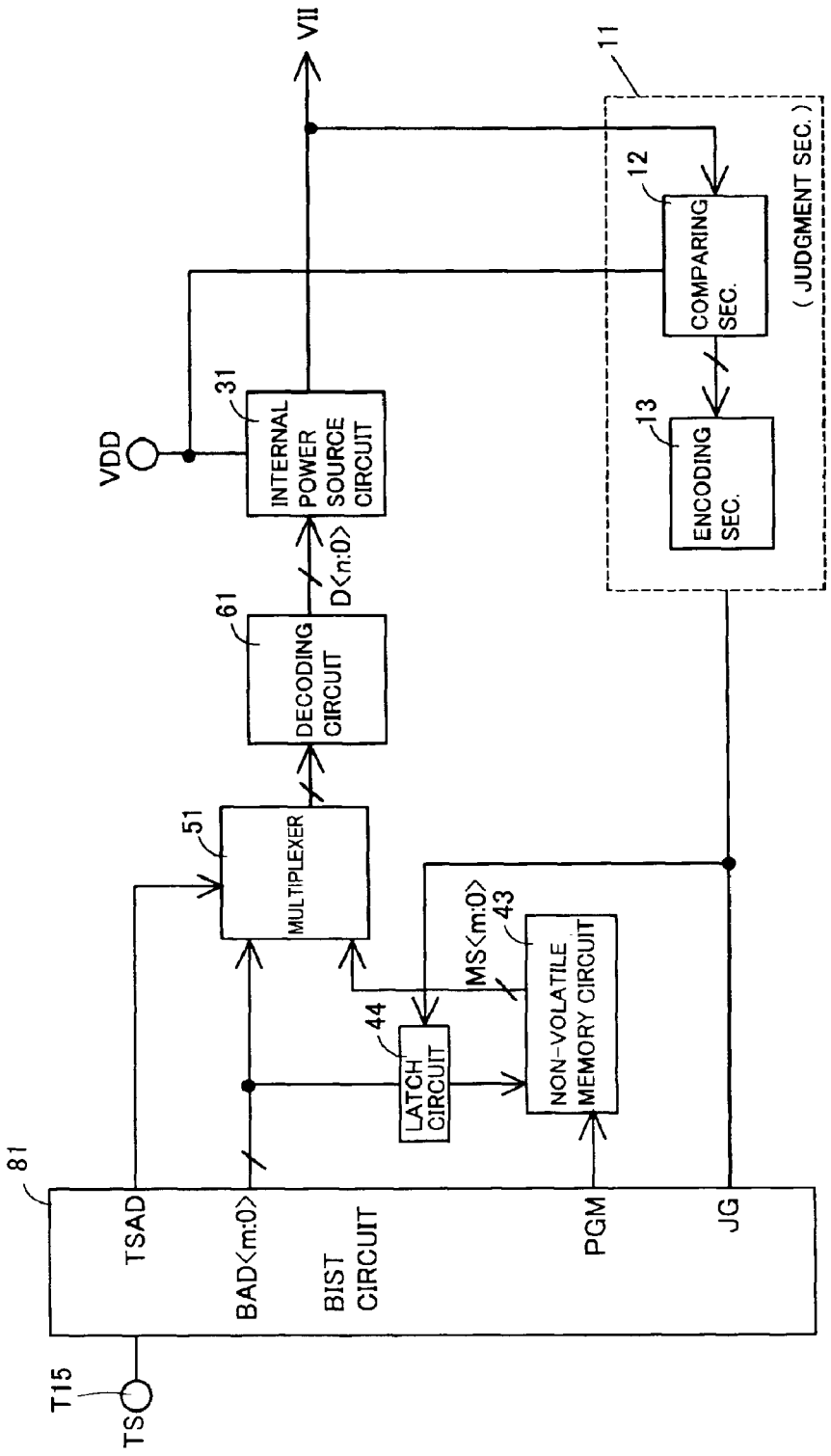
FIG. 12 is a circuit block diagram of a third embodiment.

A circuit block diagram of the third embodiment for adjustment of the internal power source voltage VII shown in FIG. 12 indicates a case where the adjustment test of the internal power source voltage VII in the semiconductor integrated circuit device provided with a self-diagnosis test (BIST) circuit 81 is executed as a self-diagnosis test by BIST circuit 81.

Additionally, this block diagram shows a case where the predetermined signals MS<m:0> are stored in a nonvolatile memory circuit 43. Because generally, data writing time to the nonvolatile memory circuit 43 is longer than increment period of the adjustment signal BAD<m:0>, this embodiment includes a latch circuit 44 for temporarily holding the adjustment signals BAD<m:0> to be stored. The adjustment signals BAD<m:0> are held on the latch circuit 44 and written into the nonvolatile memory circuit 43.

The BIST circuit 81 starts the self-diagnosis test according to the test signal TS supplied from the external terminal T15. For the adjustment test of the internal power source voltage VII, an adjustment test signal TSAD is outputted to the multiplexer 51. At the same time, the adjustment signals BAD<m:0> are transferred and outputted at every predetermined cycle. The predetermined timing mentioned here refers to a time longer than a time taken until the internal power source voltage VII is updated by the internal power source circuit 31 and the adjustment signals BAD<m:0> are fetched into the latch circuit 44 corresponding to the judgment signal JG, this time also including a time for outputting a judgment result as the judgment signal JG by the judgment section 11.

The judgment signal JG outputted from the judgment section 11 is inputted to the latch circuit 44 and functions as a latch signal and at the same time, is inputted to the BIST circuit 81. When the judgment signal JG indicating that the internal power source voltage VII turns to be a predetermined value is inputted, the adjustment signals BAD<m:0> at this time are fetched into the latch circuit 44 and the program signal PGM is outputted from the BIST circuit 81 into the nonvolatile memory circuit 43. The adjustment signals BAD<m:0> latched to the latch circuit 44 based on the program signal PGM are written into the nonvolatile memory circuit 43. At the same time, transition of the adjustment signals BAD<m:0> outputted from the BIST circuit 81 is stopped.

Figure 13:
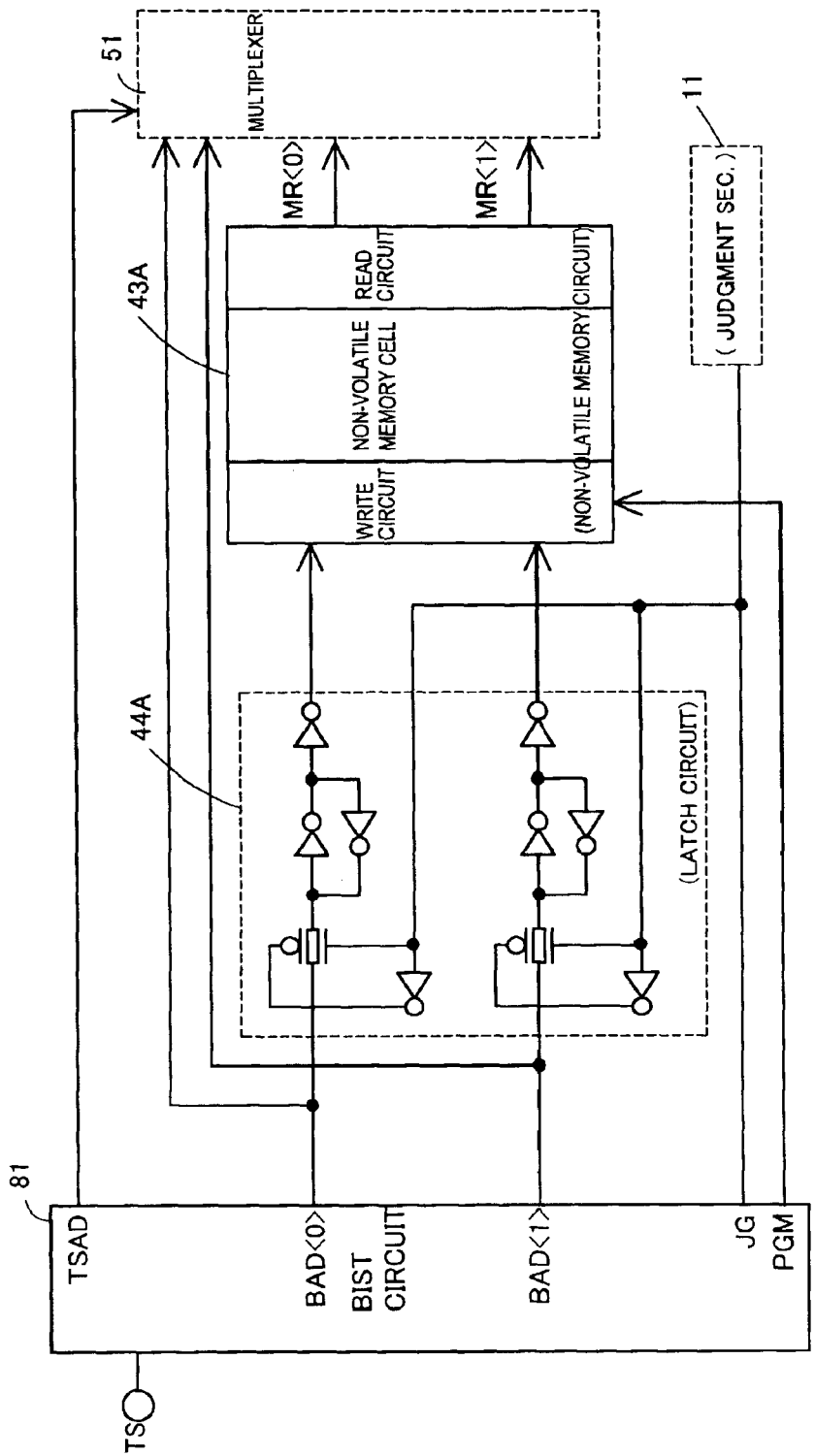
FIG. 13 is a circuit diagram of a specific example directed to the third embodiment.

FIG. 13 shows a major component circuit diagram according to a specific example of the third embodiment. This Figure indicates a case where 2-bit signals (m=1) are outputted as the adjustment signals BAD<m:0> from the BIST circuit 81. The adjustment signals BAD<1:0> outputted from the BIST circuit 81 are supplied to the multiplexer 51 and at the same time to the latch circuit 44A.

The latch circuit 44A has the same structure as the memory circuit 42A (FIG. 9). A latch section is provided for each bit of the adjustment signals BAD<1:0> and the inputted adjustment signals BAD<1:0> are connected to the latch section through transfer gate. The transfer gate is turned ON and controlled depending on the judgment signal JG. That is, the adjustment signal BAD<1:0> are fetched into the latch section because the transfer gate is turned ON by the judgment signal JG of a high level when it is determined that the internal power source voltage VII is a predetermined value. The adjustment signals BAD<1:0> fetched into the latch section is written into a nonvolatile memory cell through a write circuit of the nonvolatile memory cell based on a program signal PGM.

Because the circuit structure not indicated in FIG. 13 of the specific example of the third embodiment is the same as the circuit structure of the specific example (FIG. 4) of the first embodiment, description of that section is omitted.

Figure 14:
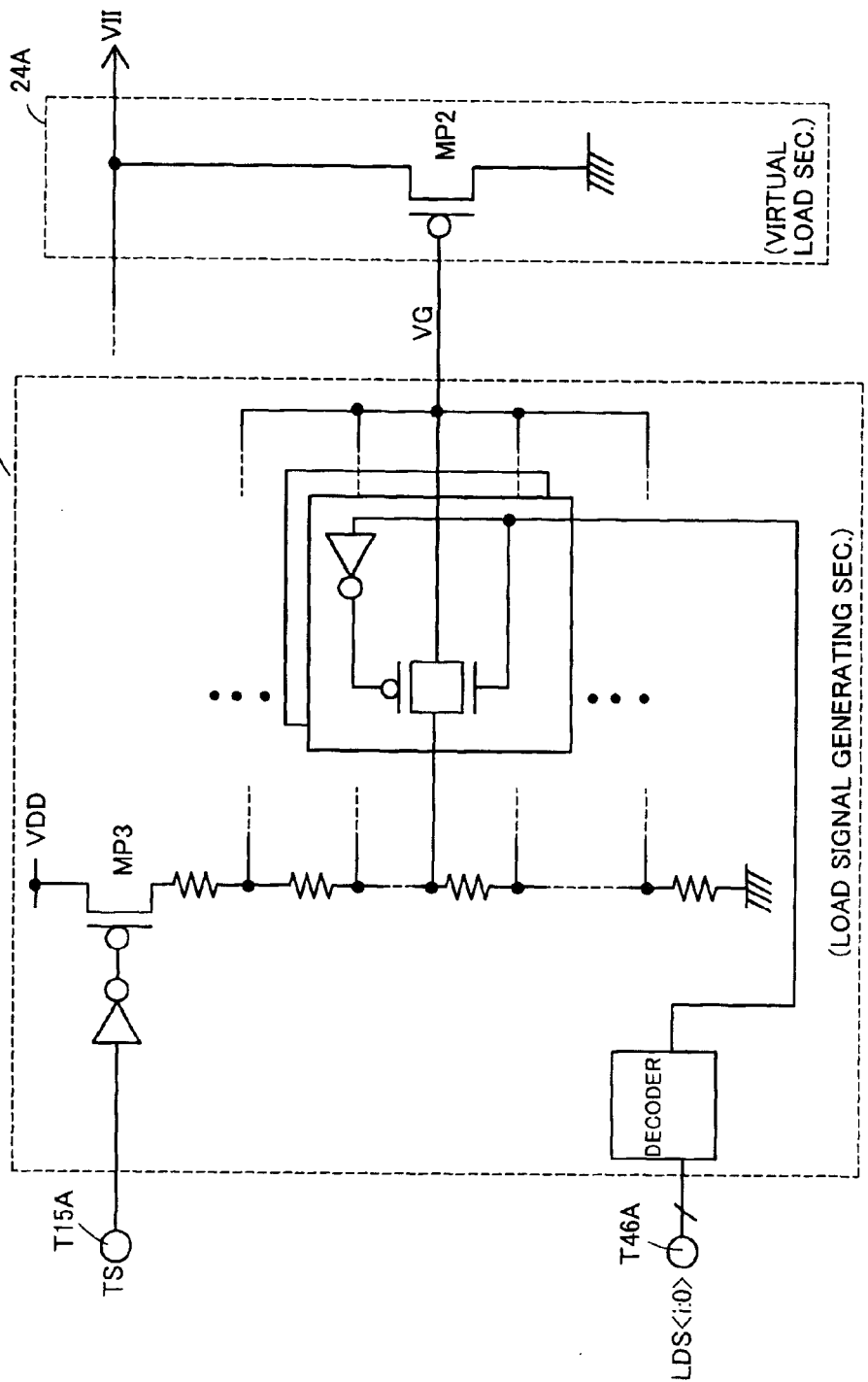
FIG. 14 is a circuit diagram of a first specific example directed to a fourth embodiment.

FIG. 14 shows a circuit diagram indicating a first specific example of the fourth embodiment of a virtual load section. A PMOS transistor MP2 is provided as the virtual load section 24A between the internal power source voltage VII and the ground voltage. A load signal generating section 94A is provided to supply a load signal VG to a gate terminal of the PMOS transistor MP2.

In the load signal generating section 94A, the PMOS transistor MP3 and resistance element array are connected in series between the power source voltage VDD and the ground voltage. A load signal VG is outputted from each connection point of the resistance element array through each transfer gate. An inverted signal of the test signal TS is inputted to the gate terminal of the PMOS transistor MP3 through an inverter gate. A load setting signals LDS<i:0> are inputted as a digital signal from external terminals T46A. The inputted load setting signals LDS<i:0> are decoded by a decoding circuit and selects a transfer gate provided at each connection point of the resistance element array and turns it ON.

The load signal VG is outputted as a predetermined voltage between the power source voltage VDD and the ground voltage so that the PMOS transistor MP2 is biased. The PMOS transistor MP2 functions as a constant current source which is turned ON with a predetermined bias state. Or it can be regarded that a resistance element having a predetermined ON resistance is connected between the internal power source voltage VII and the ground voltage. A current depending on this ON resistance flows as a load current.

The voltage value of the load signal VG can be set appropriately by exchanging a transfer gate to be turned ON depending on the load setting signals LDS<i:0>. A current value flowing as the virtual load can be set up appropriately.

Further, if the load setting signals LDS<i:0> are exchanged dynamically, a load current of the internal power source voltage VII which changes in actual operation with a time passage can be reproduced falsely.

Figure 15:
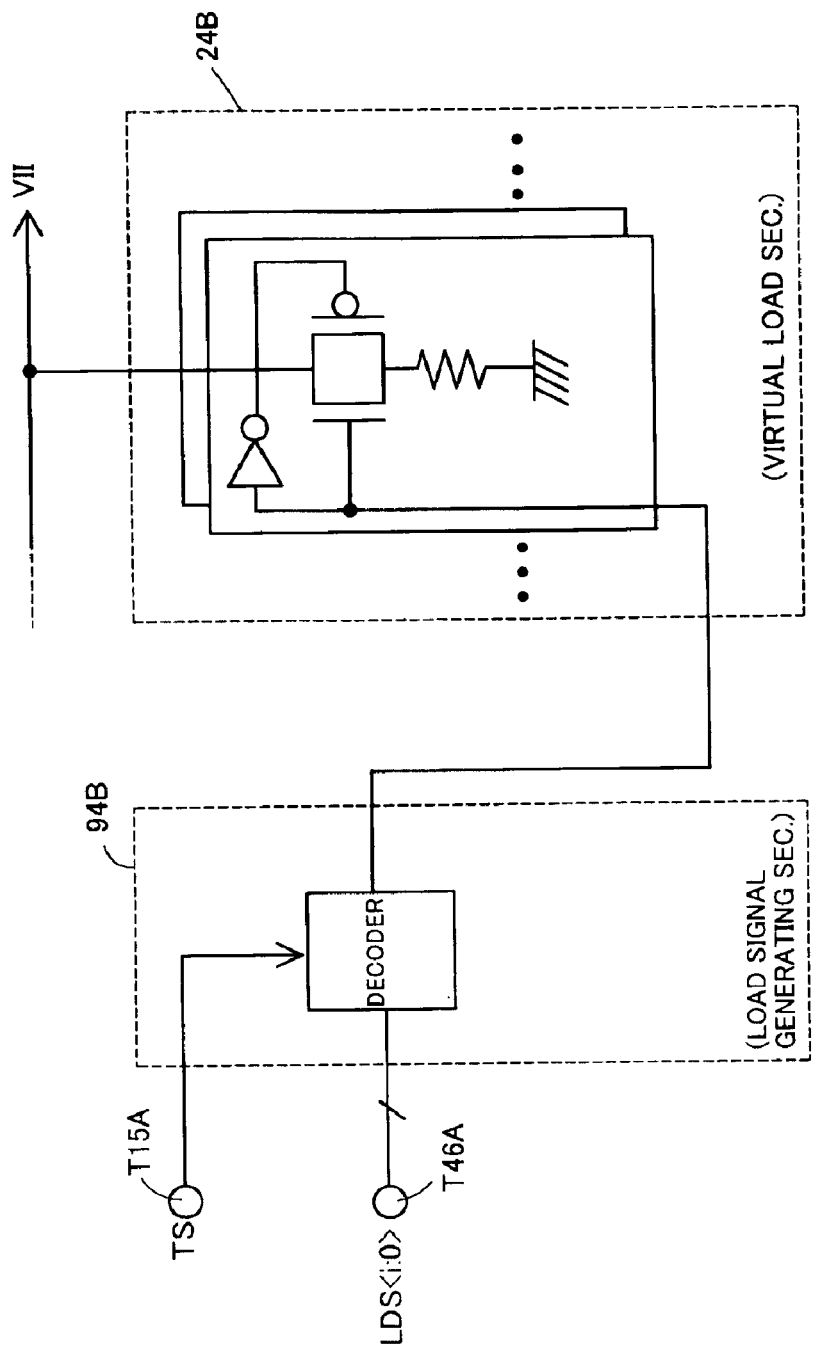
FIG. 15 is a circuit diagram of a second specific example directed to the fourth embodiment.

A second specific example of the fourth embodiment of the virtual load section shown in FIG. 15 includes a virtual load section 24B and a load signal generating section 94B. In the virtual load section 24B, the internal power source voltage VII and resistance element are selectively connected through a transfer gate, so that each transfer gate has a resistance element having a different resistance value. Consequently, a different load can be connected depending on a transfer gate to be selected and turned ON.

The load signal generating section 94B includes a decoding circuit. The load setting signals LDS<i:0> to be inputted as digital signal from the external terminals T46A are decoded. A transfer gate of the virtual load section 24B is selected by decoding signal outputted from the decoding circuit.

Although the first and second specific examples are indicated in such a condition that the load setting signals LDS<i:0> are inputted from the external terminals T46A, this signal may be generated within the semiconductor integrated circuit device.

Figure 16:
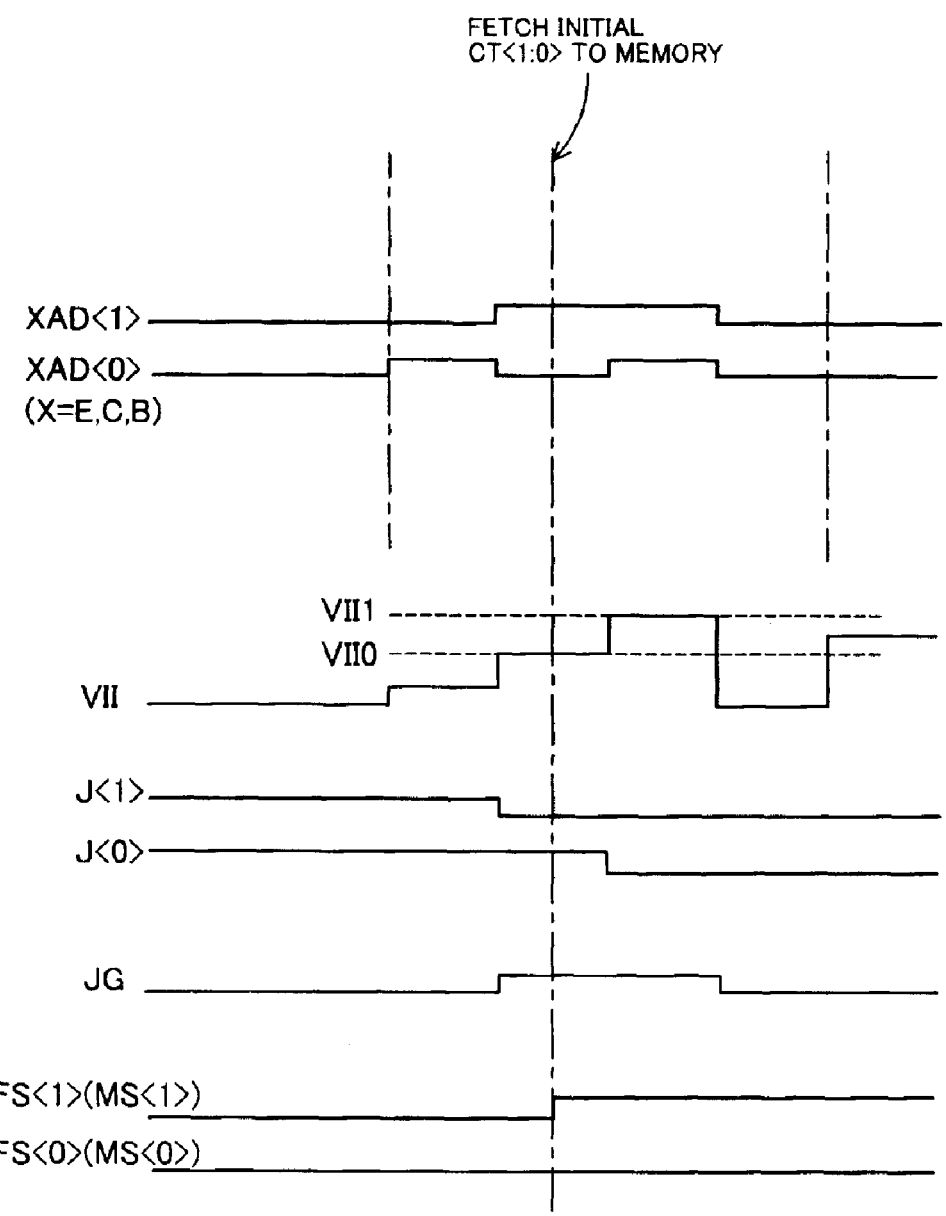
FIG. 16 shows operational waveform obtained incase multiple judgment is made.
Figure 17:
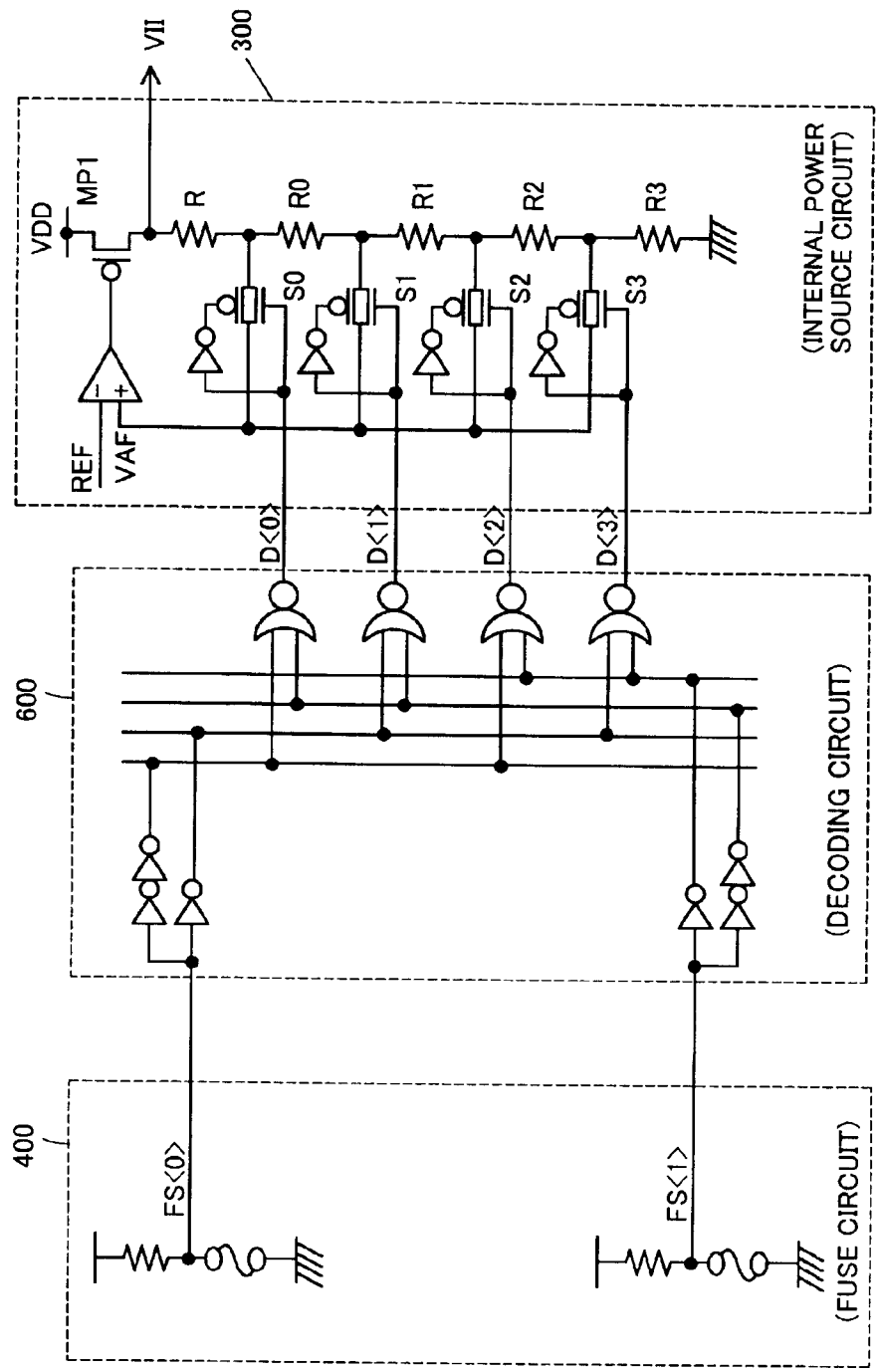
FIG. 17 is a circuit diagram of prior art.
Figure 18:
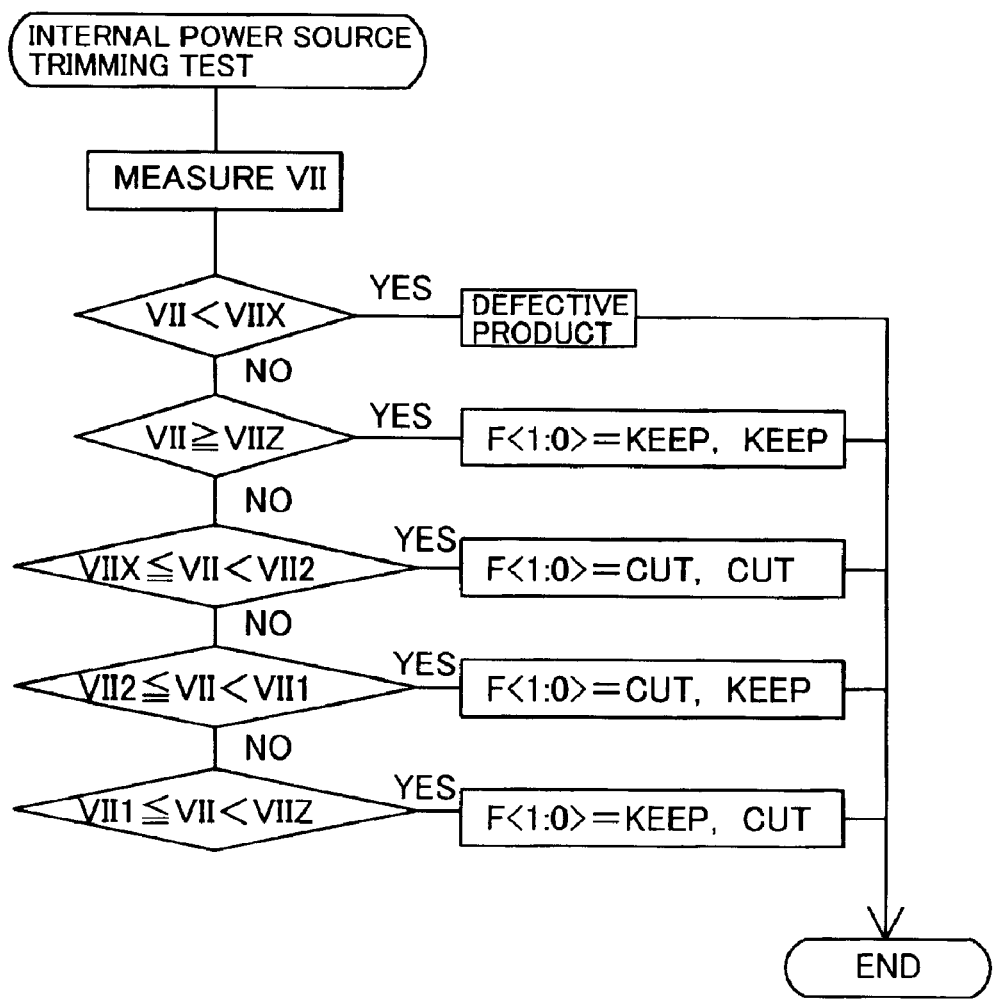
FIG. 18 is a conventional trimming test flow.

The operation waveform shown in FIG. 16 indicates a case where upon adjustment of the internal power source voltage VII, the internal power source voltage VII becomes a predetermined value with respect to adjacent paring adjustment signals XAD<1:0>(X indicates "E", "C", or "B" here). A high-level judgment signal JG is outputted at continuous two cycles. More specifically, when the adjustment signals (XAD<1>, XAD<0>)=(1, 0) are dispatched, a relation VII=VII0 is attained, so that a lower limit value in a voltage value region of the predetermined value is reached. Further, when the adjustment signals (XAD<1>, XAD<0>)=(1, 1) are dispatched, a relation of VII=VII1 is attained, so that a upper limit voltage value in a voltage value region of the predetermined value is reached. Although FIG. 16 indicates a case where the internal power source voltage VII becomes a predetermined value at continuous two cycles, there is a possibility that the internal power source voltage VII becomes the predetermined value over three or more cycles.

In such a case, if it is so set up that the adjustment signals XAD<1:0> are stored at a first cycle when the judgment signal JG becomes a high level, an accurate adjustment signals XAD<1:0> can be stored even when the judgment signal JG continues to be a high level over plural cycles.

As described above, according to the semiconductor integrated circuit device of this embodiment and the adjustment method of the semiconductor integrated circuit device, the semiconductor integrated circuit device includes the judgment section 1, 11 and the judgment step is carried out within the semiconductor integrated circuit device. For each of the adjustment signals XAD<m:0>(X indicates "E", "C", or "B"), the internal power source voltage VII which is an analog signal outputted from the internal power source circuit 31, 31A, which is an example of the analog signal generating section 3, is compared with a predetermined value and judged. Therefore, the judgment on the internal power source voltage VII can be carried out within the semiconductor integrated circuit device.

The internal power source voltage VII does not have to be outputted to an external terminal of the semiconductor integrated circuit device. Thus, the semiconductor integrated circuit device does not require provision of an output external terminal of the internal power source voltage VII or wiring for the internal power source voltage VII to the output external terminal. Consequently, care to designing on analog wiring is not required, so that designing load of the semiconductor integrated circuit device can be reduced.

Because the internal power source voltage VII is not outputted from the external terminal, any test for analog signal is not required. Only a tester device having digital test function needs to be provided for an external terminal of digital interface. It is not necessary to provide with any complicated tester device which achieves both digital function and analog function. Further, test condition exchange between digital function and analog function is not required, thereby reducing an overhead of the test time which is generated with the test condition exchange. Consequently, test cost can be reduced.

The reference voltages VII0, VII1, VII0–VII3 for setting the predetermined value are analog values and obtained by dividing the power source voltage VDD supplied from the external terminal T13A through the resistance element array of RC0–RC2, RC0–RC4 provided on the comparators 12A, 12B. If the power source voltage VDD is set to the predetermined voltage value at the time of adjustment test, any analog value for predetermined value setting does not need to be inputted from any special external terminal.

Further, the predetermined value mentioned here refers to the first and second comparison reference values. This value is a predetermined voltage value region surrounded by the reference voltages VII0 and VII1 (in case of FIG. 4) and the reference voltages VII1 and VII2 (in case of FIG. 7). Further, it is possible to judge in which region the internal power source voltage VII exists of voltage value regions partitioned by two or more comparison reference values, that is, the reference voltages VII0 and VII1, VII0 to VII3. Consequently, a difference between the internal power source voltage VII and the predetermined value can be grasped, so that the adjustment signal can be transferred depending on the judgment signal JG, JG<2:0> and brought near the predetermined value rapidly.

Preferably, the judgment section 1, 11 includes plural comparing sections C0, C1 (in case of FIG. 4) or C0–C3 (in case of FIG. 7) for comparing the internal power source voltage VII with the reference voltage and encoding sections 13A, 13B in which comparison signals are inputted from plural comparing sections and which identifies in which voltage value region the internal power source voltage exists. Consequently, if the judgment signal JG, JG<2:0>, which is an encoding signal, includes a digital signal having bit number capable of identifying a voltage value region, a judgment result can be expressed with digital signal of minimum bit number. As for the external terminal for outputting the judgment signal JG, a minimum number of those terminals only has to be secured.

Storage of the predetermined signals FS<m:0> into a fuse circuit (or memory circuit) 41, 41A having fuse elements or memory elements, which act as a predetermined signal storing section, can be carried out independently under an external control such as a tester device. After a sequence of test based on the tester device is completed, the storage operation can be carried out.

If the predetermined signal storing section is constituted of memory circuits (fuse circuits) 42, 42A, 43, 43A, by generating the control signal within the semiconductor integrated circuit device based on the judgment signal JG, the writing of the adjustment signals CAD<m:0>, BAD<m:0> into the memory elements can be executed. Further, by providing the semiconductor integrated circuit device with a circuit structure for cutting off fuse elements electrically, the fuse elements can be cut out depending on the adjustment signals CAD<m:0>, BAD<m:0> based on the judgment signal JG.

The memory elements may be constituted of volatile memory cells used for SRAM, DRAM or the like, like the memory circuit 42A. Further, the memory elements may be constituted of nonvolatile memory cells electrically rewritable, provided on a flush memory or the like, like the memory circuit 43, 43A. Additionally, this function may be achieved by a circuit structure having data holding function such as a register, flip-flop instead of the memory cell.

Further, because virtual load step is executed under provision of the virtual load sections 24A, 24B, virtual load can be connected appropriately when the internal power source voltage VII is adjusted. Various kinds of operation conditions in the semiconductor integrated circuit device such as digital function, other analog function can be reproduced falsely. Consequently, the internal power source voltage VII can be adjusted under a load condition near the actual operation.

In the meantime, the present invention is not restricted to the above-described embodiments, but needless to say, may be improved or modified in various ways within a scope not departing from the gist of the present invention.

For example, although under these embodiments, the internal power source circuit is taken as an example of the analog signal generating section and a case where the internal power source voltage VII is adjusted as the analog signal has been described, the present invention is not restricted to this example. Additionally, the present invention may be applied to a case in which a necessity of adjusting other analog values such as bias voltage, bias current exists.

In this case, the virtual load section may be so constructed to connect a current source as a load or to connect an impedance element on a power source or an analog signal path.

Although as the fourth embodiment, a case where the PMOS transistor or a resistance element is connected as the virtual load section, the present invention is not restricted to this example. Needless to say, the virtual load section may be constituted of the NMOS transistor, a junction FET, bipolar transistor, diode, capacitor or the like, or other active element or passive element or an appropriate combination of these elements.

According to the semiconductor integrated circuit device and the adjustment method of the same semiconductor integrated circuit device of the present invention, when analog signal outputted from the analog signal generating section such as an internal power source circuit incorporated in the semiconductor integrated circuit device is adjusted, a result of comparison and judgment between the analog signal and a predetermined value does not need be outputted through an external terminal outside the semiconductor integrated circuit device. Further, the result of comparison and judgment may be converted to digital signal and outputted through the external terminal. That is, an external tester device and test method can be simplified so that the adjustment test can be carried out accurately and rapidly. Further, a pseudo load can be connected to an analog signal depending on load setting signal and therefore, the analog signal can be adjusted under a similar load condition to the actual operation of the semiconductor integrated circuit device.

What is claimed is:

1. A semiconductor integrated circuit device comprising:
   an analog signal generating section for outputting an analog signal; and
   a predetermined signal storing section for storing at least one predetermined signal that is supplied to the analog signal generating section and sets the analog signal to a predetermined value, wherein digital signals are used for input/output interface to external terminals, for adjusting the analog signal, the semiconductor integrated circuit device further comprises a judgment section for outputting at least one judgment signal that corresponds to a comparison result of the analog signal corresponding to at least one adjustment signal and the predetermined value generated based on power source voltage, for each adjustment signal supplied to the analog signal generating section in accordance with a test signal, and in case the judgment signal judges that the analog signal has the predetermined value, the adjustment signal corresponding to the as-judged analog signal is stored in the predetermined signal storing section as the predetermined signal.

2. A semiconductor integrated circuit device according to claim 1 further comprising a signal selecting section that is controlled by the test signal and supplies either the adjustment signal or the predetermined signal to the analog signal generating section.

3. A semiconductor integrated circuit device according to claim 1, wherein the adjustment or the predetermined signal is digital signals of two or more than two bits and inputted to a decoding section arranged at a preceding stage of the analog signal generating section.

4. A semiconductor integrated circuit device according to claim 1, wherein the predetermined value is a predetermined analog value region between a first comparison reference value and a second comparison reference value, and the judgment signal judges which analog value region sectioned by two or more comparison reference values including the first and the second comparison reference values the analog signal exists in.

5. A semiconductor integrated circuit device according to claim 4, wherein the judgment section includes:

a plurality of comparing sections for comparing the analog signal with each of the two or more comparison reference values; and an encoding section for outputting encoding signals in a manner of receiving output signals from the plurality of comparing sections and discriminating the analog value region where the analog signal exists.

6. A semiconductor integrated circuit device according to claim 4, wherein the two or more comparison reference values are obtained by lowering/dividing power source voltage.

7. A semiconductor integrated circuit device according to claim 1, wherein the analog signal generating section is an internal power source voltage generating section and outputs internal power source voltage as the analog signal.

8. A semiconductor integrated circuit device according to claim 1, wherein the predetermined signal storing section includes memory elements or fuse elements, and the predetermined signal storing section is controlled inside the semiconductor integrated circuit device based on the judgment signal for data-write on the memory elements or cutting out the fuse elements.

9. A semiconductor integrated circuit device according to claim 1, wherein the judgment signal is a digital signal and outputted from the external terminal.

10. A semiconductor integrated circuit device according to claim 1, wherein the predetermined signal storing section includes fuse elements or memory elements, and based on external control to the judgment signal outputted, data-write on the memory elements or cutting out of the fuse elements is conducted.

11. A semiconductor integrated circuit device according to claim 1 further comprising an adjustment signal generating section for outputting the adjustment signal in order under activation control by the test signal.

12. A semiconductor integrated circuit device according to claim 11, wherein the adjustment signal generating section includes an oscillation section for outputting an oscillation signal having predetermined frequency, and counter section for counting the oscillation signal, transitioning and outputting the adjustment signal with constant cycle based on the predetermined frequency.

13. A semiconductor integrated circuit device according to claim 1 further comprising a self-diagnosis test circuit for executing predetermined tests for the predetermined internal circuits inside the semiconductor integrated circuit device, wherein adjustment test of the analog signal is executed as one of tests by the self-diagnosis test circuits.

14. A semiconductor integrated circuit device according to claim 13, wherein the test signal, the adjustment signal, and the judgment signal are inputted to/outputted from the self-diagnosis test circuit.

15. An adjustment method of a semiconductor integrated circuit device that generates an analog signal having a predetermined value based on at least one predetermined signal stored and uses digital signals for input/output interface to external terminals, for adjusting the analog signal, the adjustment method comprising the steps of:

a signal generating step for generating the analog signal that corresponds to at least one adjustment signal;

a judgment step for judging a comparison result of the analog signal generated and the predetermined value generated based on power source voltage, the judgment step being executed inside the semiconductor integrated circuit device; and a storing step for storing the adjustment signal as the predetermined signal in case the analog signal is judged as having the predetermined value through the judgment step.

16. An adjustment method of a semiconductor integrated circuit device according to claim 15, wherein the adjustment signal makes stepwise transition and the signal generating step and the judgment step are repeated for each adjustment signal.

17. An adjustment method of a semiconductor integrated circuit device according to claim 15, wherein the storing step is executed inside the semiconductor integrated circuit device.

18. An adjustment method of a semiconductor integrated circuit device according to claim 15, wherein judgment of the comparison result is outputted from at least one of the external terminals in a form of at least one digital signal.

19. An adjustment method of a semiconductor integrated circuit device according to claim 18, wherein the storing step is controlled outside the semiconductor integrated circuit device.

20. An adjustment method of a semiconductor integrated circuit device according to claim 19, wherein the storing step includes: a signal obtaining step for obtaining the adjustment signal as the predetermined signal in case the analog signal is judged as having the predetermined value; and a write step for writing the obtained predetermined signal in a predetermined signal storing section.

* * * * *